United States Patent
Kwon et al.

(10) Patent No.: US 9,436,052 B2
(45) Date of Patent: Sep. 6, 2016

(54) LIQUID CRYSTAL DISPLAY AND MANUFACTURING METHOD THEREOF

(71) Applicant: Samsung Display Co., Ltd., Yongin, Gyeonggi-Do (KR)

(72) Inventors: Oh Jeong Kwon, Hwaseong-si (KR); Dong-Chul Shin, Seoul (KR); Hyeok Jin Lee, Seongnam-si (KR); Ki Chul Shin, Seongnam-si (KR)

(73) Assignee: SAMSUNG DISPLAY CO., LTD. (KR)

( * ) Notice: Subject to any disclaimer, the term of this patent is extended or adjusted under 35 U.S.C. 154(b) by 120 days.

(21) Appl. No.: 14/485,014

(22) Filed: Sep. 12, 2014

(65) Prior Publication Data
US 2015/0268527 A1 Sep. 24, 2015

(30) Foreign Application Priority Data
Mar. 18, 2014 (KR) .......................... 10-2014-0031845

(51) Int. Cl.
*G02F 1/1362* (2006.01)
*H01L 27/12* (2006.01)
*G02F 1/1337* (2006.01)
*G02F 1/1343* (2006.01)

(52) U.S. Cl.
CPC ..... *G02F 1/136286* (2013.01); *H01L 27/1262* (2013.01); *G02F 1/13624* (2013.01); *G02F 1/133707* (2013.01); *G02F 1/133788* (2013.01); *G02F 2001/134345* (2013.01)

(58) Field of Classification Search
CPC .................. G02F 1/136286; G02F 1/133707; G02F 1/133788; G02F 1/13624
See application file for complete search history.

(56) References Cited

U.S. PATENT DOCUMENTS

| | | | |
|---|---|---|---|
| 6,335,778 B1 | 1/2002 | Kubota et al. | |
| 9,213,205 B2* | 12/2015 | Kim | G02F 1/134336 |
| 2005/0253836 A1* | 11/2005 | Kim | G02F 1/136286 |
| | | | 345/212 |
| 2011/0074761 A1* | 3/2011 | Xiao | G09G 3/3614 |
| | | | 345/211 |
| 2012/0057117 A1 | 3/2012 | Li et al. | |
| 2012/0081652 A1 | 4/2012 | Su et al. | |
| 2012/0105785 A1* | 5/2012 | Kim | G09G 3/3648 |
| | | | 349/139 |
| 2012/0320019 A1 | 12/2012 | Jeong et al. | |
| 2013/0208225 A1 | 8/2013 | Kwon et al. | |

FOREIGN PATENT DOCUMENTS

| KR | 1020080102798 A | 11/2008 |
|---|---|---|
| KR | 1020100007360 A | 1/2010 |

* cited by examiner

*Primary Examiner* — Anne Hines
(74) *Attorney, Agent, or Firm* — Cantor Colburn LLP

(57) ABSTRACT

A liquid crystal display includes: a first and second substrates disposed opposite to each other; a gate line and a divided reference voltage line on the first substrate; a gate insulating layer on the gate line and the divided reference voltage line; a semiconductor layer on the gate insulating layer; a data line on the semiconductor layer; a passivation layer on the data line; a pixel electrode on the passivation layer; and a common electrode on the second substrate, where the divided reference voltage line and the data line are connected to a data driving line extension and a divided reference voltage driving line extension at a side of the first substrate, a common voltage driving line extension is at a side of the first substrate, the divided reference, common and data voltage driving line extensions are linearly connected to each other through resistors having different resistances.

9 Claims, 23 Drawing Sheets

LIQUID CRYSTAL DISPLAY AND MANUFACTURING METHOD THEREOF

This application claims priority to Korean Patent Application No. 10-2014-0031845 filed on Mar. 18, 2014, and all the benefits accruing therefrom under 35 U.S.C. §119, the content of which in its entirety is herein incorporated by reference.

BACKGROUND (a) Field

Exemplary embodiments of the invention relate to a manufacturing method of a liquid crystal display, and a liquid crystal display manufactured by the method.

(b) Description of the Related Art

A liquid crystal display ("LCD"), which is one of the most widely used types of flat panel displays ("FPD"), typically includes two display panels including electric field generating electrodes provided therein, and a liquid crystal layer interposed between the two display panels. The LCD may display an image by applying a voltage to the electric filed generating electrodes and realigning liquid crystal molecules in the liquid crystal layer to adjust an amount of light transmitting therethrough.

In such an LCD, various initial alignment methods for pretilting liquid crystal molecules have been proposed to obtain a quick response speed of the liquid crystal molecules.

Among the various initial alignment methods, in an alignment method in which prepolymers polymerized by light such as ultraviolet rays are used to pretilt the liquid crystal molecules, the field generating electrodes are respectively applied with desired voltages and are then exposed to the light.

In a manufacturing method of the LCD, a multi-layered thin film pattern may be formed on a mother substrate by performing a deposition process, a photolithography process, etc., and a plurality of display panels including the multi-layered thin film pattern may be formed, and a mother substrate including the plurality of display panels may be cut to manufacture the display device.

When the voltage is applied in an initial alignment process of the liquid crystal molecules during a manufacturing process, if the cut LCDs are applied with the voltage and exposed to the light, a lot of equipment is used and manufacturing time is increased, thereby resulting in low productivity.

In such a manufacturing method of the LCD, the voltage is applied to a data line of a lower panel and a common electrode of an upper display panel in the initial alignment process of the liquid crystal molecules to photo-align the liquid crystal molecules.

In such an initial alignment process of the liquid crystal molecules, when two input voltages are provided and thus a separate voltage is not applied to a dividing reference voltage line, and pretilt angles of the liquid crystal molecules in high gray pixel electrode regions of one pixel are substantially the same each other.

In such an initial alignment process of the liquid crystal molecules, an additional input voltage may be applied to differently align the pretilt angles of the liquid crystal molecules in the high and low gray pixel electrodes regions of one pixel.

SUMMARY

Exemplary embodiments of the invention relate to a manufacturing method of a liquid crystal display through photo-aligning liquid crystal molecules in respective sub-pixel regions in each pixel such that the liquid crystal molecules in the sub-pixel regions have different pretilt angles from each other by connecting a data line pad, a divided reference voltage line pad, and a common voltage line pad through resistors, adjusting resistances thereof, and then generating three output voltages with two input voltages.

An exemplary embodiment of the invention provides a liquid crystal display including: a first substrate; a gate line disposed on the first substrate; a divided reference voltage line disposed on the first substrate and electrically separated from the gate line; a gate insulating layer disposed on the gate line and the divided reference voltage line; a semiconductor layer disposed on the gate insulating layer; a data line disposed on the semiconductor layer; a passivation layer disposed on the data line; a pixel electrode disposed on the passivation layer; a second substrate disposed opposite to the first substrate; and a common electrode disposed on the second substrate. In such an embodiment, the divided reference voltage line and the data line are elongated to a first side of the first substrate such that the divided reference voltage line and the data line are respectively connected to a divided reference voltage driving line and a data driving line, a data driving line extension connected to the data driving line, a divided reference voltage driving line extension connected to the divide reference voltage driving line, and a common voltage driving line extension are disposed at the first side of the first substrate, a first spacer is disposed on the data driving line extension to contact the second substrate, the divided reference voltage driving line extension and the common voltage driving line extension are connected to each other through a first resistor, the divided reference voltage driving line extension and the data driving line extension are connected to each other through a second resistor, and a first resistance of the first resistor is greater than a second resistance of the second resistor.

In an exemplary embodiment, a ratio of the first resistance to the second resistance may be in a range of about 1:0.2 to about 1:0.5.

In an exemplary embodiment, a common voltage driving line connected to the common voltage driving line extension may be disposed in a second side of the first substrate, and the common voltage driving line may be connected to the second substrate via a second spacer disposed therebetween in the second region.

In an exemplary embodiment, each of the first and second resistors may include an indium zinc oxide ("IZO") wire, and a length of the IZO wire of the first resistor may be longer than a length of the IZO wire of the second resistor.

In an exemplary embodiment, each of the first and second resistors may include an IZO wire, and a width of the IZO wire of the first resistor may less than a width of the IZO wire of the second resistor.

In an exemplary embodiment, each of the first and second resistors may include a semiconductor material, and a width of the first resistor may be less than a width of the second resistor.

In an exemplary embodiment, each of the first and second resistors may include a semiconductor material, and a length of the first resistor may be longer than a length of the second resistor.

In an exemplary embodiment, the semiconductor material may be n+ hydrogenated amorphous silicon in which an n-type impurity is highly doped.

In an exemplary embodiment, the pixel electrode may include a first subpixel electrode and a second subpixel electrode, and a pretilt angle of liquid crystals in a first subpixel electrode region corresponding to the first subpixel electrode is different from the pretilt angle of the liquid crystals of the liquid crystals in a second subpixel electrode region corresponding to the second subpixel electrode.

An exemplary embodiment of the invention provides a method of manufacturing a liquid crystal display, including: providing a lower mother substrate, on which a plurality of lower display panels including thin film transistors is defined and coated with a lower alignment layer; providing an upper mother substrate, on which a plurality of upper display panels respectively corresponding to the plurality of lower display panels is defined and coated with an upper alignment layer; forming a mother substrate assembly by providing a liquid crystal mixture layer including liquid crystals between the lower and upper mother substrates, and combining the lower mother substrate with the upper mother substrate; dividing each display panel into a first region and a second region by providing a first dividing line and a second dividing line in each upper display panel of the upper mother substrate of the mother substrate assembly; pretilting the liquid crystals by applying first and second voltages to the first region and the second region of the upper mother substrate, respectively, through portions of the upper mother substrate not covered by the lower mother substrate, where the first and second voltages are different from each other; and hardening an alignment aid, which is provided in at least one of the liquid crystal mixture layer, the lower alignment layer, and the upper alignment layer, by irradiating light from the upper mother substrate onto the mother substrate assembly. In such an embodiment, the first voltage applied to the first region is transmitted to a data line of a pixel of the lower display panel, the second voltage applied to the second region is transmitted to a common electrode of the upper display panel, and a voltage corresponding to a difference between the first and second voltages respectively applied to the first and second regions is transmitted to a divided reference voltage line of the pixel of the lower display panel.

In an exemplary embodiment, a data driving line extension, a divided reference voltage driving line extension, and a common voltage driving line extension may be provided in the lower mother substrate of the first region, a first spacer may be provided on the data driving line extension to contact the upper mother substrate, the divided reference voltage driving line extension and the common voltage driving line extension may be connected to each other through a first resistor, the divided reference voltage driving line extension and the data driving line extension may be connected to each other through a second resistor, and a first resistance of the first resistor may be greater than a second resistance of the second resistor.

In an exemplary embodiment, a ratio of the first resistance to the second resistance may be in a range of about 1:0.2 to about 1:0.5.

In an exemplary embodiment, each of the first and second resistors may include an IZO wire, a length of the IZO wire of the first resistor may be longer than a length of the IZO wire of the second resistor, and a width of the IZO wire of the first resistor may be less than a width of the IZO wire of the second resistor.

In an exemplary embodiment, each of the first and second resistors may include a wire, and the wire of each of the first and second resistors may be simultaneously provided with a pixel electrode and using a same material as the pixel electrode In an exemplary embodiment, a common voltage driving line connected to the common voltage driving line extension may be provided in the lower mother substrate of the second region, and the common voltage driving line may be connected to the upper mother substrate through a second spacer disposed therebetween in the second region.

In an exemplary embodiment, a plurality of pixels including a data line, a divided reference voltage line, a first subpixel electrode, a second subpixel electrode and a common electrode may be provided in the mother substrate assembly, and a potential generated in the first subpixel electrode based on the first and second voltages may be greater than a potential generated in the second subpixel electrode based on the first and second voltages.

In an exemplary embodiment, a pretilt angle of the liquid crystals in a first subpixel electrode region corresponding to the first subpixel electrode may be different from a pretilt angle of the liquid crystals of a second subpixel electrode region corresponding to the second subpixel electrode.

In an exemplary embodiment, each of the first and second resistors may include a semiconductor material, and the first resistor may have a smaller width or a longer length than the second resistor.

In an exemplary embodiment, each of the first and second resistors may include a semiconductor material, and the first and second resistors may be simultaneously provided with a thin film transistor of the lower display panel and using a same material as a semiconductor layer of the thin film transistor.

In an exemplary embodiment, the semiconductor material may be n+ hydrogenated amorphous silicon in which an n-type impurity is highly doped.

As described above, exemplary embodiments of the invention provide the manufacturing method of the liquid crystal display through photo-aligning liquid crystal molecules in respective subpixel regions in each pixel such that the liquid crystal molecules in respective subpixel regions have different pretilt angles from each other in each pixel by connecting a data line pad, a divided reference voltage line pad and a common voltage line pad through resistors, adjusting resistances thereof, and then generating three output voltages with two input voltages.

BRIEF DESCRIPTION OF THE DRAWINGS

The above and other features of the invention will become more apparent by describing in further detail exemplary embodiments thereof with reference to the accompanying drawings, in which:

FIG. 19B is a cross-sectional view taken along line B-B' of the mother substrate assembly of FIG. 18;

DETAILED DESCRIPTION OF THE EMBODIMENTS

Figure 1:
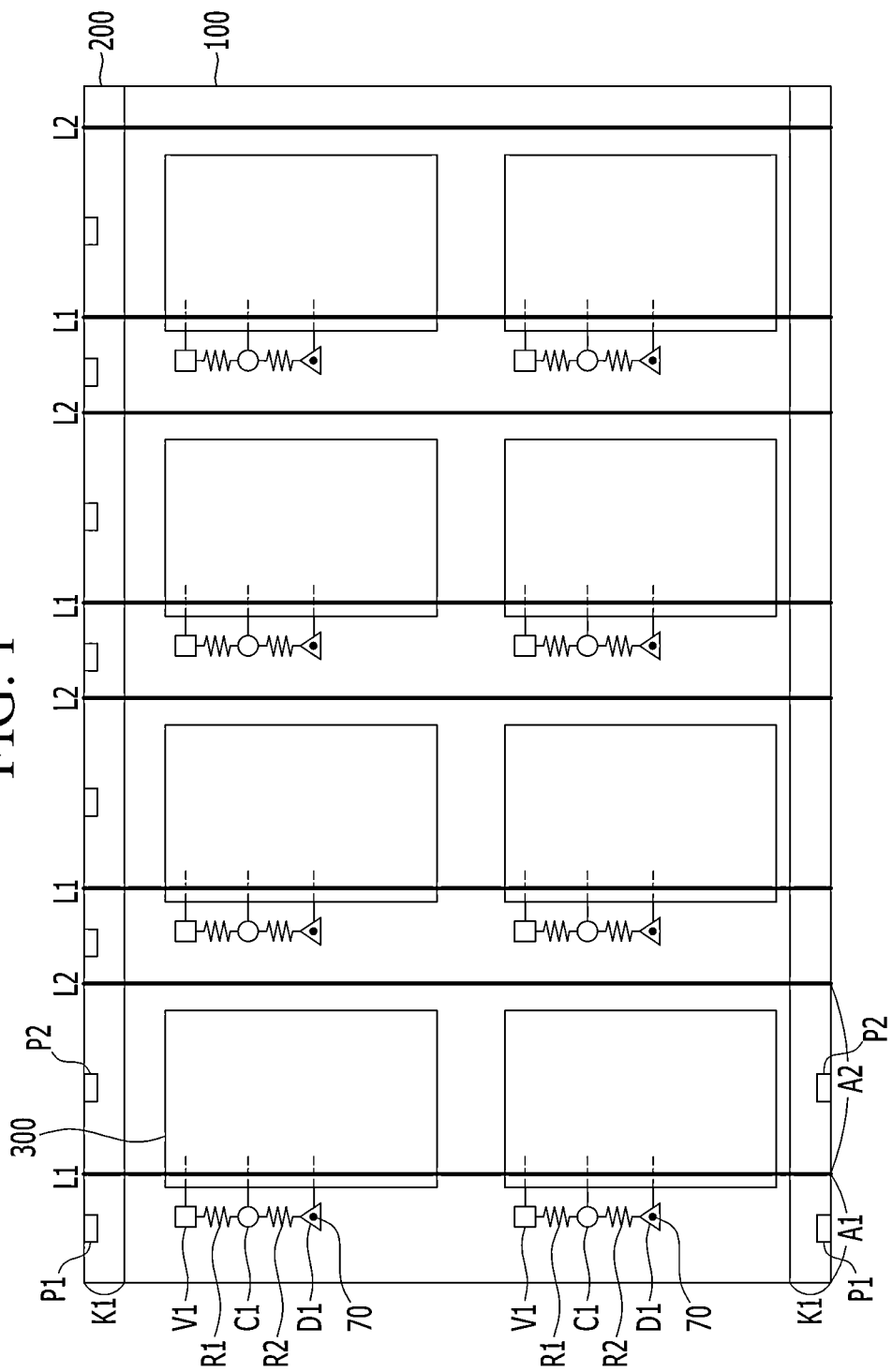
FIG. 1 is a block diagram of a mother substrate assembly in an exemplary embodiment of a manufacturing method of a liquid crystal display according to the invention.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, exemplary embodiments of a liquid crystal display device according to the invention will be described in detail with reference to the accompanying drawings.

Exemplary embodiments of the invention will now be described in detail with reference to the drawings.

First, an exemplary embodiment of a manufacturing method of a liquid crystal display according to the invention will be described with reference to FIGS. 1 to 3.

FIG. 1 is a block diagram showing a mother substrate assembly in an exemplary embodiment of a manufacturing method of a liquid crystal display according to the invention.

Referring to FIG. 1, in an exemplary embodiment of a manufacturing method of a liquid crystal display, a plurality of lower display panels 300 are provided, e.g., formed, in a lower mother substrate 100.

When viewed as an equivalent circuit, each lower display panel 300 includes a plurality of signal lines, and a plurality of pixel areas connected thereto and arranged substantially in a matrix form.

A gate driving line (not shown) connected to gate lines of respective pixels, a data driving line D1 connected to a data line, a divided reference voltage driving line C1 connected to a divided reference voltage line, and a common voltage driving line V1 are formed in the lower display panel 300.

Extensions of respective driving lines are formed outside a lower display panel region.

In an exemplary embodiment, an extension (illustrated as a triangle) is provided at one end of each data driving line D1, and an extension (illustrated as a circle) is provided at one end of each divided reference voltage driving line C1.

In such an embodiment, an extension (illustrated as a quadrangle) is provided at one end of each data driving line V1.

For convenience of illustration and description, extensions having different shapes are shown in FIG. 1, but not being limited thereto. In an alternative exemplary embodiment, each extension may have a same shape as each other.

In one exemplary embodiment, for example, each extension may have a quadrangular shape.

A first spacer 70 is provided, e.g., formed, on the data driving line extension D1 such that the data driving line extension D1 is short-circuited with an upper mother substrate.

The data driving line transmits a voltage applied to an upper mother substrate 200 through the first spacer 70 to the lower display panel.

A voltage applying method will be described later in greater detail.

The respective extensions are connected to each other via resistors, e.g., a first resister R1 and a second resistor R2.

A connection configuration of the respective extensions and the resistors will now be described in detail with reference to FIG. 2.

Figure 2:
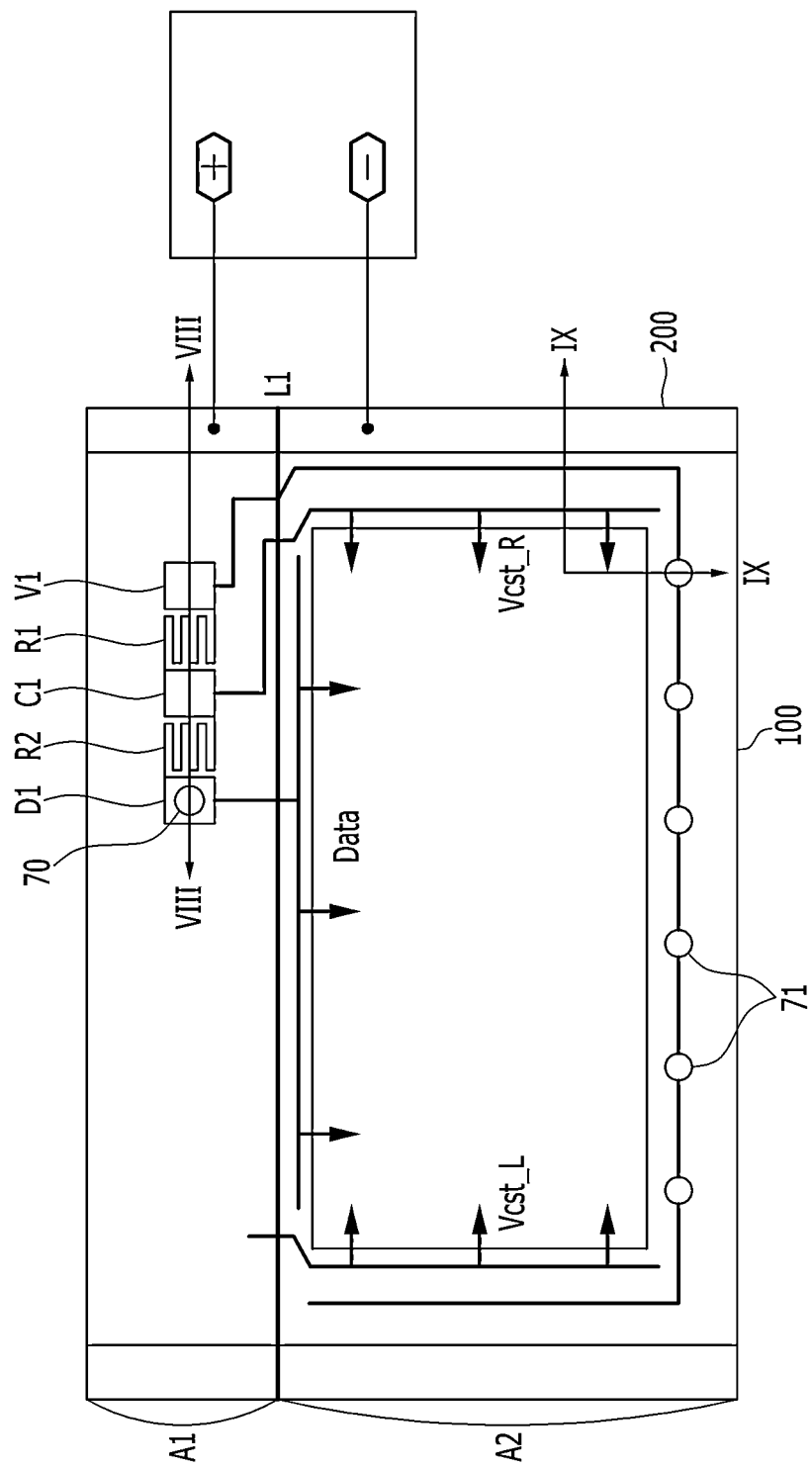
FIG. 2 is a block diagram showing a display panel portion of an exemplary embodiment of the mother substrate assembly according to the invention.

FIG. 2 is a block diagram of a display panel portion of an exemplary embodiment of the mother substrate assembly according to the invention.

Referring to FIG. 2, the data driving line extension D1 and the divided reference voltage driving line extension C1 are connected to each other through the second resistor R2.

In such an embodiment, the divided reference voltage driving line extension C1 and the common voltage driving line V1 are connected through the first resistor R1.

In such an embodiment, the divided reference voltage driving line extension is respectively connected to the common voltage driving line extension and the data driving line extension through resistors, such that the divided reference voltage driving line outputs a third voltage that is different from first and second voltages applied to the common voltage driving line extension C1 and the data driving line extension D1, respectively.

The third voltage may be varied based on the first and second resistors R1 and R2 that are connected to opposite ends of the divided reference voltage driving line extension C1, which will be described later in greater detail.

The data driving line extending from the data driving line extension D1 is connected to the lower display panel disposed in the lower mother substrate 100 such that the data driving line is connected to the data lines of a plurality of pixels in each lower display panel.

The divided reference voltage driving line extending from the divided reference voltage driving line extension C1 is connected to the divided reference voltage lines of the plurality of pixels in each lower display panel.

In such an embodiment, the common voltage driving line extending from the common voltage driving line extension V1 extends along an outer edge of the lower display panel, and is connected to the upper mother substrate 200 through a second spacer 71.

Figure 3:
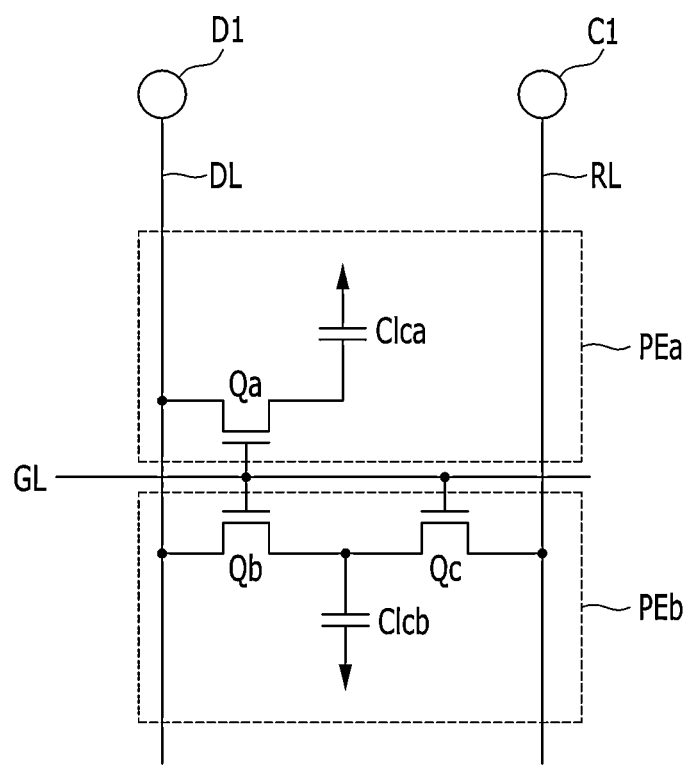
FIG. 3 is an equivalent circuit diagram of an exemplary embodiment of a pixel of a display panel according to the invention.

FIG. 3 is an equivalent circuit diagram of an exemplary embodiment of a pixel of a display panel according to the invention.

Referring to FIG. 3, the data line DL of each pixel is connected to the data driving line D1, and the divided reference voltage line RL is connected to the divided reference voltage driving line C1.

Although not illustrated in FIG. 3, the gate line GL of each pixel may be connected to the gate driving line.

An exemplary embodiment of the manufacturing method of the liquid crystal display according to the invention will now be described in detail.

In such an embodiment, the manufacturing method of the liquid crystal display includes providing the mother substrate, on which a plurality of lower display panels including thin film transistors is provided, and is coated with a lower alignment layer.

Now, a pixel of the lower display panel of an exemplary embodiment of the mother substrate assembly according to the invention will be described with reference to FIGS. 3 to 5.

Figure 4:
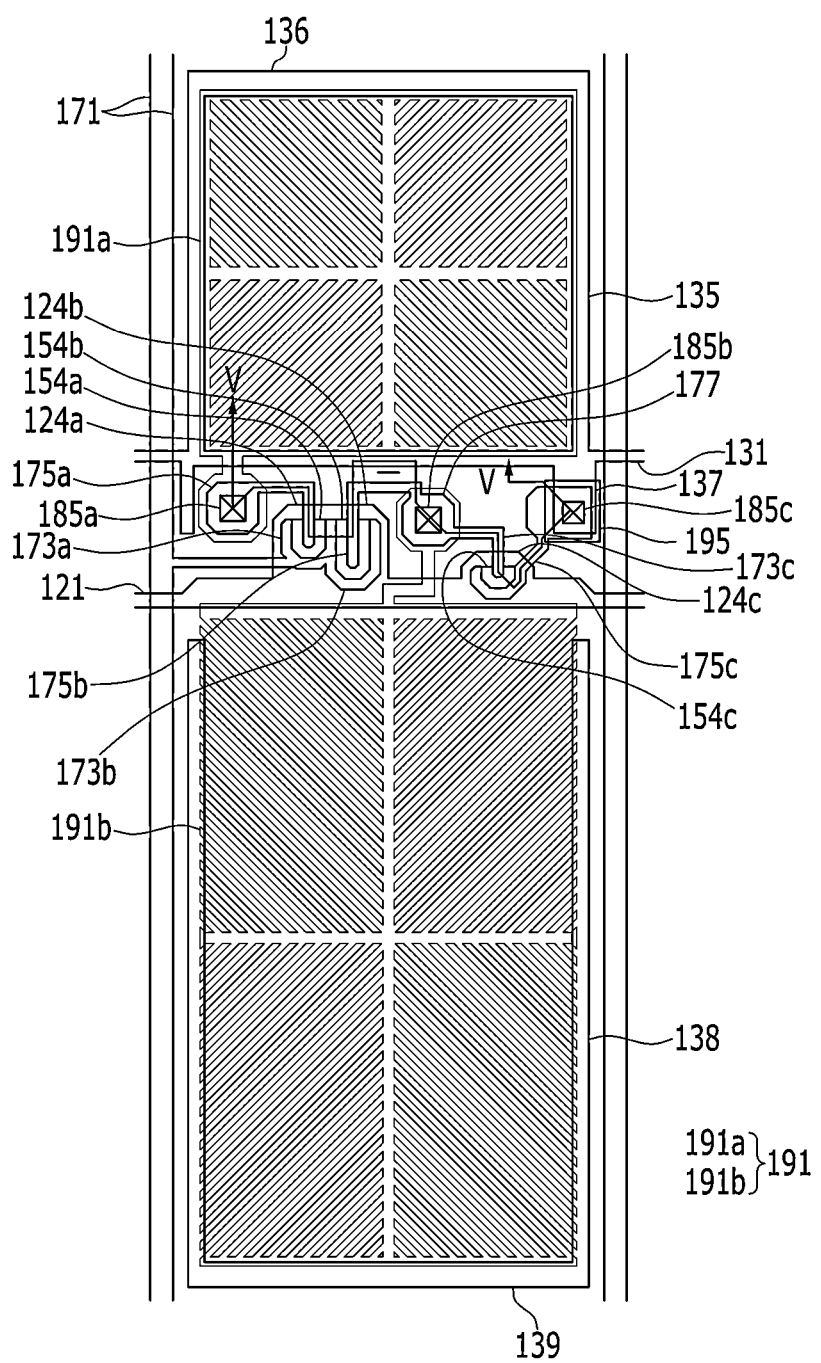
FIG. 4 is a plane view of a pixel of an exemplary embodiment of the liquid crystal display according to the invention.
Figure 5:
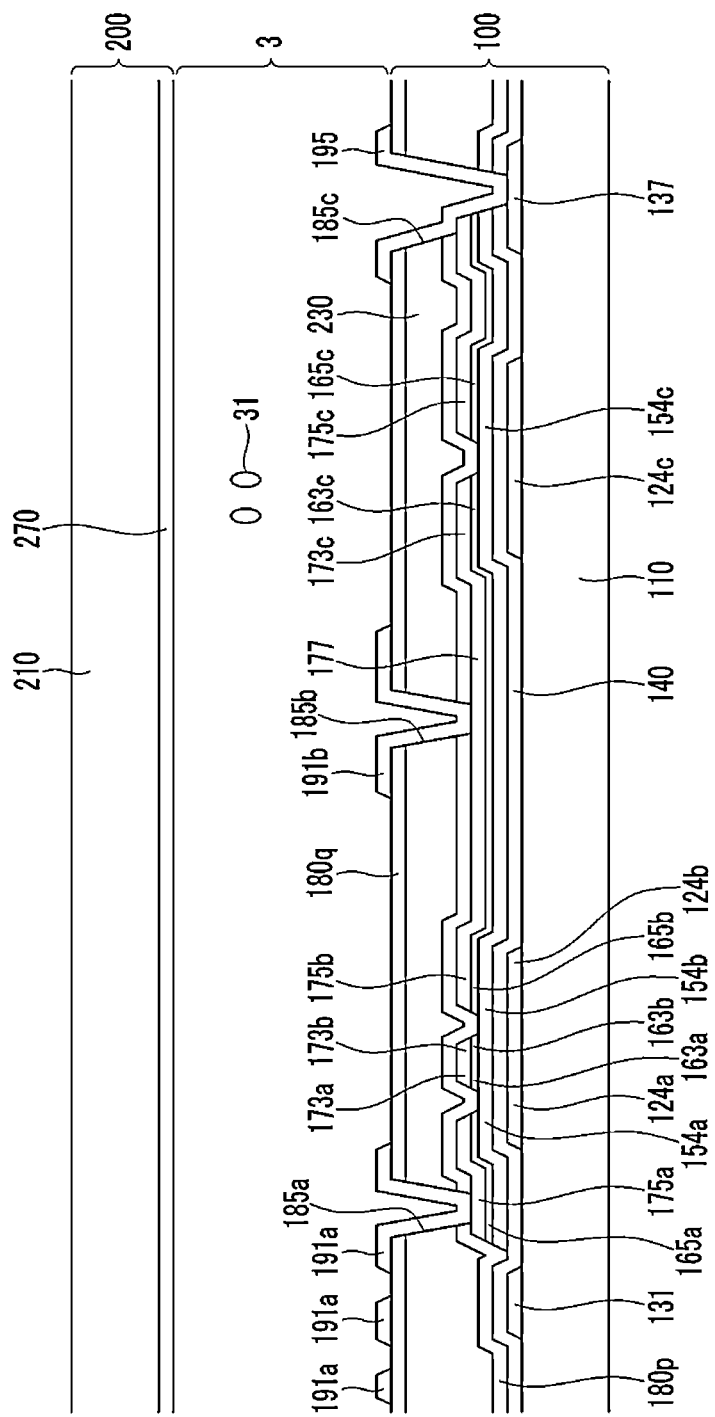
FIG. 5 is a cross-sectional view taken along line V-V of the liquid crystal display of FIG. 4.

FIG. 4 is a plan view of a pixel of an exemplary embodiment of the liquid crystal display according to the invention, and FIG. 5 is a cross-sectional view taken along line V-V of the liquid crystal display of FIG. 4.

Referring to FIG. 3, in an exemplary embodiment, a pixel of the lower display panel 300 may include a plurality of signal lines including a gate line GL for transmitting gate signals, a data line DL for transmitting data signals, and a divided reference voltage line RL for transmitting a divided reference voltage, and first to third switching elements Qa, Qb and Qc, and first and second liquid crystal capacitors Clca and Clcb that are connected to the plurality of signal lines.

The first and second switching elements Qa and Qb are respectively connected to the gate line GL and the data line DL, and the third switching element Qc is connected to an output terminal of the second switching element Qb and the divided reference voltage line RL.

The first and second switching elements Qa and Qb are three-terminal elements such as thin film transistors, control terminals thereof are connected to the gate lines GL, input terminals thereof are connected to the data lines DL, an output terminal of the first switching element Qa is connected to the first liquid crystal capacitor Clca, and an output terminal of the second switching element Qb is connected to the second liquid crystal capacitor Clcb and an input terminal of the third switching Qc.

The third switching element Qc is also a three-terminal element such as a thin film transistor, a control terminal thereof is connected to the gate line GL, an input terminal thereof is connected to the second liquid crystal capacitor Clcb, and an output terminal thereof is connected to the divided reference voltage line RL.

Referring to FIGS. 4 and 5 together with FIG. 3, a structure of a pixel area of the lower display panel will be described in greater detail.

First, the lower display panel 100 will be described.

In an exemplary embodiment, the lower display panel 100 includes a first insulation substrate 110 including a transparent material such as glass or plastic, for example, and the lower display panel 100 further includes a gate line 121, a reference voltage line 131, and a storage electrode 135 which are disposed on the first insulation substrate 110.

The gate line 121 extends substantially in a horizontal direction to transmit gate signals.

The gate line 121 includes a wide end portion (not shown) for connection with a first gate electrode 124a, a second gate electrode 124b, and a third gate electrode 124c or an external driving circuit.

The reference voltage line 131 may extend substantially parallel to the gate line 121 and includes an extension 137, and the extension 137 is connected to a third drain electrode 175c, which will be described later in greater detail.

The reference voltage line 131 includes the storage electrodes 135, 136, 138 and 139 surrounding the pixel area.

A gate insulating layer 140 is disposed on the gate line 121, the reference voltage line 131, and the storage electrodes 135, 136, 138 and 139.

A first semiconductor 154a, a second semiconductor 154b, and a third semiconductor 154c, which may include amorphous or crystalline silicon, are disposed on the gate insulating layer 140.

A plurality of ohmic contacts 163a, 163b, 163c, 165a, 165b and 165c are formed on the first semiconductor 154a, the second semiconductor 154b and the third semiconductor 154c.

In an alternative exemplary embodiment, where the semiconductors 154a, 154b and 154c include oxide semiconductors, the ohmic contacts may be omitted.

The data line 171 includes data conductors 173a, 173b, 173c, 175a, 175b and 175c including a first source electrode 173a, a second source electrode 173b, a first drain electrode 175a, a second drain electrode 175b, the third source electrode 173c and the third drain electrode 175c, which are disposed on the ohmic contacts 163a, 163b, 163c, 165a, 165b and 165c, and the gate insulating layer 140. The second drain electrode 175b is connected to the third source electrode 173c via a connection portion 177.

In such an embodiment, the first gate electrode 124a, the first source electrode 173a and the first drain electrode 175a collectively define a first thin film transistor Qa together with the first semiconductor 154a, and a channel of the thin film transistor is formed in the semiconductor 154a between the first source electrode 173a and the first drain electrode 175a.

In such an embodiment, the second gate electrode 124b, the second source electrode 173b, and the second drain electrode 175b collectively define a second thin film transistor Qb together with the second semiconductor 154b, and a channel of the thin film transistor is formed in the semiconductor 154b between the second source electrode 173b and the second drain electrode 175b, while third gate electrode 124c, the third source electrode 173c. In such an embodiment, the third drain electrode 175c collectively define a third thin film transistor Qc together with the semiconductor 154c, and a channel of the thin film transistor is formed in the semiconductor 154c between the third source electrode 173c and the third drain electrode 175c.

A first passivation layer 180p, which may include an inorganic insulator such as a silicon nitride or a silicon oxide, for example, is disposed on the data conductors 171, 173a, 173b 173c, 175a, 175b and 175c and exposed portions of the semiconductors 154a, 154b and 154c.

A color filter 230 is disposed on the first passivation layer 180p.

In an exemplary embodiment, a light blocking member (not shown) may be disposed on regions where the color filter 230 is not disposed and on a part of the color filter 230.

The light blocking member is also referred to as a black matrix, and effectively prevents light leakage.

In an exemplary embodiment, a capping layer (not shown) may be disposed on the color filter 230.

The capping layer may effectively prevent the color filter 230 from lifting, suppress contamination of the liquid crystal layer due to an organic material such as a solvent coming from the color filter 230, and effectively prevent defects such as an afterimage when a screen is driven.

A first subpixel electrode 191a is disposed on the capping layer.

Referring to FIG. 4, the first subpixel electrode 191a includes a cross-shaped stem portion disposed at a central region of the pixel area, and a plurality of first branch electrodes extending from the cross-shaped stem portion.

The first branch electrodes extend in four directions.

The first branch electrodes extend to form a planar shape including four trapezoids that surround the cross-shaped connection portion.

In an exemplary embodiment, a second passivation layer 180q is may be formed on the capping layer and the first subpixel electrode 191a.

A second subpixel electrode 191b is disposed on the second passivation layer 180q.

The second subpixel electrode 191b is disposed opposite to the first subpixel electrode 191a with respect to the gate line 121.

In an alternative exemplary embodiment, the second subpixel electrode 191b may have a square, a central portion of which may be hexagonally formed to be empty.

The second subpixel electrode 191b includes a cross-shaped stem portion disposed at a central region of the pixel area, and a plurality of second branch electrodes extending from the cross-shaped stem portion.

The second branch electrodes extend in four directions.

In an exemplary embodiment, the first and second subpixel electrodes 191a and 191b may include or be formed of a transparent material such as indium tin oxide ("ITO") and indium zinc oxide ("IZO"), for example, or a reflective metal such as aluminum, silver, chromium, or alloys thereof, for example.

A first contact hole 185a is defined through the first passivation layer 180p and the capping layer to partially expose the first drain electrode 175a, and a second contact hole 185b is defined through the first passivation layer 180p, the capping layer, and the second passivation layer 180q to partially expose the second drain electrode 175b. A third contact hole 185c is defined through the gate insulating layer 140, the semiconductor 154c, the first passivation layer 180p, the capping layer, and the second passivation layer 180q to partially expose the extension 137 of reference voltage line 131. A bridge electrode 195 may be further provided to electrically connect the extension 137 with the third source electrode 173c through the third contact hole 185c.

The first subpixel electrode 191a is physically and electrically connected to the first drain electrode 175a through the first contact hole 185a, and the second subpixel electrode 191b is physically and electrically connected to the second drain electrode 175b through the second contact hole 185b.

The first and second subpixel electrodes 191a and 191b are applied with a data voltage from the first and second drain electrodes 175a and 175b through the first and second contact holes 185a and 185b, respectively.

When the first and second subpixel electrodes 191a and 191b are applied with a data voltage, the data voltage applied to the second drain electrode 175b is partially divided by the third source electrode 173c such that a voltage applied to the first subpixel electrode 191a is greater than that applied to the second subpixel electrode 191b.

The first and second subpixel electrodes 191a and 191b applied with the data voltage generate an electric field together with a common electrode 270 of the upper display panel to determine directions of liquid crystal molecules 31 of the liquid crystal layer 3 between the two electrodes 191 and 270.

Accordingly, luminance of light passing through a liquid crystal layer 3 may be controlled based on the determined directions of the liquid crystal molecules.

A lower alignment layer (not shown) is disposed on the first and second subpixel electrodes 191a and 191b.

The lower alignment layer may be a vertical alignment layer or a horizontal alignment layer.

The lower alignment layer may include an alignment aid for initial alignment of liquid crystals.

The alignment aid may be a reactive monomer, and for example, may include an ultraviolet ("UV") curing monomer.

In such an embodiment, the lower alignment layer may further include a UV curing initiator.

In one exemplary embodiment, for example, the UV curing monomer may be an acrylate monomer, and the UV curing initiator may be formed of a material that absorbs light of a UV wavelength, such as 2,2-dimethoxy-1,2-diphenyl ethanone.

Referring to FIG. 2, the data driving line extension D1, the divided reference voltage driving line extension C1, and the common voltage driving line extension V1 are provided in the lower display panel, and the data driving line extension D1 and the divided reference voltage driving line C1 extension are connected through the second resistor R2.

In an exemplary embodiment, the divided reference voltage driving line extension C1 and the common voltage driving line extension V1 are connected through the first resistor R1.

The driving lines extending from the data driving line extensions and the divided reference voltage driving line extensions are connected to the plurality of pixels in the lower display panel.

Figure 6:
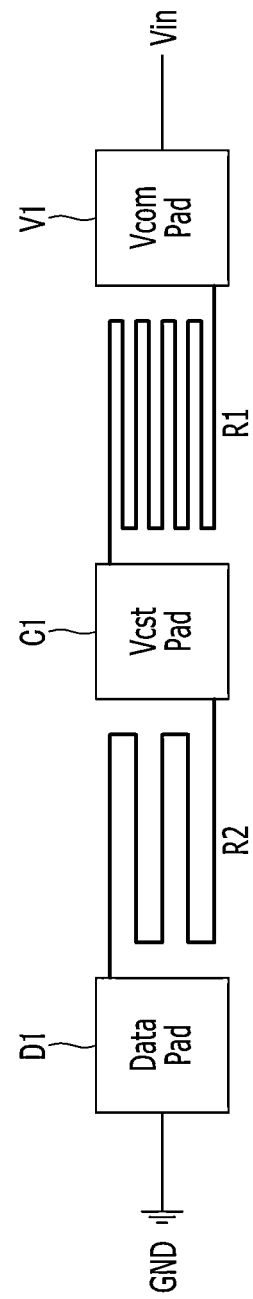
FIG. 6 is a block diagram showing driving line extensions of an exemplary embodiment of the mother substrate assembly according to the invention.

FIG. 6 is a block diagram showing the respective driving line extensions.

Referring to FIG. 6, in an exemplary embodiment of the invention, the resistors R1 and R2 may be wires formed of the same material as the pixel electrode.

Thus, the resistors R1 and R2 may be simultaneously formed when forming the pixel electrode.

In an exemplary embodiment of the invention, the resistors R1 and R2 may include or be formed of an IZO wire.

In an exemplary embodiment of the invention, the data driving line extension (data pad) and the divided reference voltage driving line extension (Vcst pad) are connected through the second resistor R2, and the divided reference voltage driving line extension (Vcst pad) and the common voltage driving line extension (Vcom pad) are connected through the first resistor R1.

In an exemplary embodiment of the invention, the first resistor R1 connected between the Vcst pad and the Vcom pad has higher resistance than the resistor R2.

In an exemplary embodiment, where the resistors R1 and R2 are formed of the IZO wire that connects the respective pads, the IZO wire of the first resistor R1 is longer than the IZO wire of the second resistor R2 such that the resistance of the first resistor R1 becomes greater than the resistance of the second resistor R2.

In such an embodiment, the IZO wire for connecting the Vcst pad and the Vcom pad may have a longer length than the IZO wire for connecting the data pad and the Vcst pad.

In an exemplary embodiment of the invention, a ratio of the resistance of the first resistor R1 to the resistance of the second resistor R2 may be in a range of about 1:0.2 to about 1:0.5.

In such an embodiment, the resistance of the second resistor R2 corresponds to about 20% to about 50% of the resistance of the first resistor R1.

The ratio may be determined to control a voltage output to the divided reference voltage driving line, which will be described later in detail.

Table 1 shows resistance according to length and width of the IZO wire when the IZO wire is used as a resistor in exemplary embodiments of the invention.

TABLE 1

|  | Exemplary Embodiment 1 | | Exemplary Embodiment 2 | |
| --- | --- | --- | --- | --- |
|  | R1 | R2 | R1 | R2 |
| Resistivity | 3.85E−06 Ω · m | 3.85E−06 Ω · m | 3.85E−06 Ω · m | 3.85E−06 Ω · m |
| Thickness | 550 Angstroms (Å) | 550 Å | 550 Å | 550 Å |
| Width | 100 micrometers (um) | 100 um | 100 um | 100 um |
| Length | 7140 um | 3850 um | 1430 um | 770 um |
| Resistance | 5 kiloohms (KΩ) | 2.692 KΩ | 1 KΩ | 0.539 KΩ |

Referring to Table 1, by using the IZO having the resistivity of 3.85E-06 ohm meters ($\Omega \cdot m$), the length of the resistors R1 and R2 are set to be different from each other to differently set the resistances of the resistors R1 and R2.

Values in Table 1 are exemplarily provided and thus are applicable to an exemplary embodiment, but not being limited thereto. In an exemplary embodiment, the width of the wire is fixed and the length is varied, or the length of the wire may be fixed and the width may be varied, to control the resistances to be different from each other.

In an alternative exemplary embodiment, the thickness of the wire may be controlled.

In an exemplary embodiment, referring back to FIG. 1, the upper mother substrate 200 is provided, in which a plurality of upper display panels respectively corresponding to a plurality of lower display panels are provided and on which an upper alignment layer is coated.

Each upper display panel includes a plurality of pixel areas respectively corresponding to a plurality of pixel areas of each lower display panel.

Each pixel area of the lower display panel and each pixel area of the upper display panel corresponding to each other defines a pixel as a unit that displays images.

The upper mother substrate 200 may include a second insulation substrate 210, a common electrode 270 disposed on the second insulation substrate 210, and an alignment layer disposed on the common electrode 270.

The upper alignment layer may be a vertical alignment layer.

The upper alignment layer may include an alignment aid for initial alignment of the liquid crystals.

The alignment aid may be a reactive monomer, and for example, may include an UV curing monomer.

In an exemplary embodiment, the lower alignment layer may further include a UV curing initiator.

In one exemplary embodiment, for example, the UV curing monomer may be an acrylate monomer, and a UV curing initiator may include or be formed of a material that absorbs light of a UV wavelength, such as 2,2-dimethoxy-1,2-diphenyl ethanone.

The upper mother substrate 200 may be larger than the lower mother substrate 100.

Referring to FIG. 1, as the upper mother substrate 200 is larger than the lower mother substrate 100, portions of the upper mother substrate 200 do not face the lower mother substrate 100 (e.g., a portion of the upper mother substrate 200 exposed by the lower mother substrate 100), and such portions are illustrated as "K1" in FIG. 1 (hereinafter, will be referred to as a "region K1").

The region K1 may be provided in one of four sides of the upper mother substrate 200, in both the upper and lower sides, or in all four sides.

Referring to FIGS. 1 and 2, the upper mother substrate 200 may be divided into regions A1 and A2 that are separated along cutting lines L1 and L2 in later steps.

In an exemplary embodiment, the regions A1 and A2 may include voltage applying units P1 and P2 that are provided in one end of the region K1 where the upper and lower mother substrates do not face each other.

Subsequently, the regions A1 and A2 of the upper mother substrate 200 may be applied with the voltage through the voltage applying units P1 and P2, respectively.

In an alternative exemplary embodiment, the upper mother substrate 200 may not include the voltage applying units P1 and P2, and the voltage may be directly applied to the upper mother substrate 200 without going through the voltage applying units P1 and P2.

Next, a liquid crystal mixture layer including the liquid crystals is provided between the upper and lower mother substrates, and the upper and lower mother substrates are combined to form a mother substrate assembly.

In an exemplary embodiment, the liquid crystals may have negative dielectric anisotropy.

A liquid crystal mixture may further include an alignment aid.

The alignment aid may be a reactive monomer, and for example, may include an UV curing monomer.

In such an embodiment, the liquid crystal mixture may further include a UV curing initiator.

In one exemplary embodiment, for example, the UV curing monomer may be an acrylate monomer, and a UV curing initiator may include or be formed of a material that absorbs light of a UV wavelength, such as 2,2-dimethoxy-1,2-diphenyl ethanone.

Figure 8:
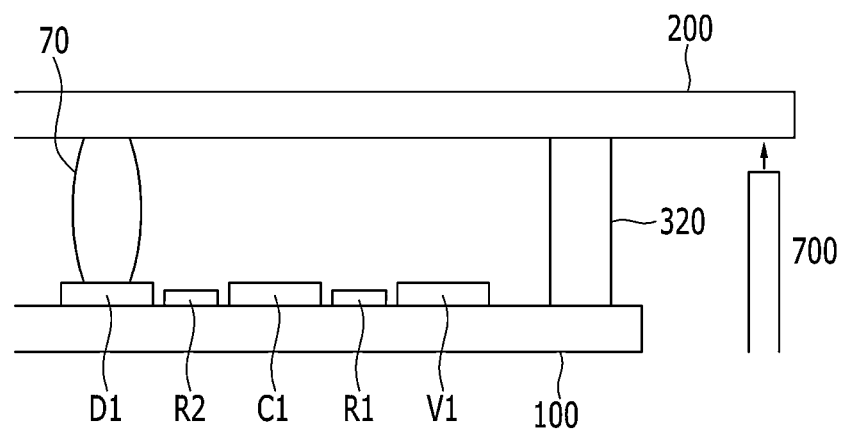
FIG. 8 is a cross-sectional view taken along line VIII-VIII of the mother substrate assembly of FIG. 2.

FIG. 8 is a cross-sectional view taken along line VIII-VIII of the mother substrate assembly of FIG. 2.

Referring to FIG. 8, the upper and lower mother substrates 200 and 100 are sealed by a sealant 320. In such an embodiment, where the upper mother substrate 200 is larger than the lower mother substrate 100, a portion of the upper mother substrate 200 is partially exposed, while not corresponding to the lower mother substrate 100.

In such an embodiment, the upper mother substrate 200 partially extends outwardly from a sealant 320.

The first spacer 70 provided in the data driving line extension D1 of the lower mother substrate allows the data driving line extension D1 to contact the upper mother substrate 200.

Thus, in such an embodiment of the mother substrate assembly, the data driving line D1 on the lower mother substrate contacts the upper mother substrate 200 through the first spacer 70.

Next, the upper mother substrate is cut to be divided into two regions per panel.

The division may be performed by cutting the upper mother substrate with a laser.

Alternatively, other methods except for a laser may be used to cut the upper mother substrate.

For convenience of description, the divided regions will now be referred to as a first region (region A1) and a second region (region A2).

FIG. 8 is a cross-section view taken along line VIII-VIII of the mother substrate assembly of FIG. 2, which illustrates the first region (region A1).

As described above, the data driving line extension D1, the divided reference voltage driving line extension C1 and the common voltage driving line extension V1 are provided in the lower mother substrate, and the first spacer 70 is provided on the data driving line extension D1.

The first spacer 70 allows the data driving line extension D1 to contact the upper mother substrate 200.

Figure 9:
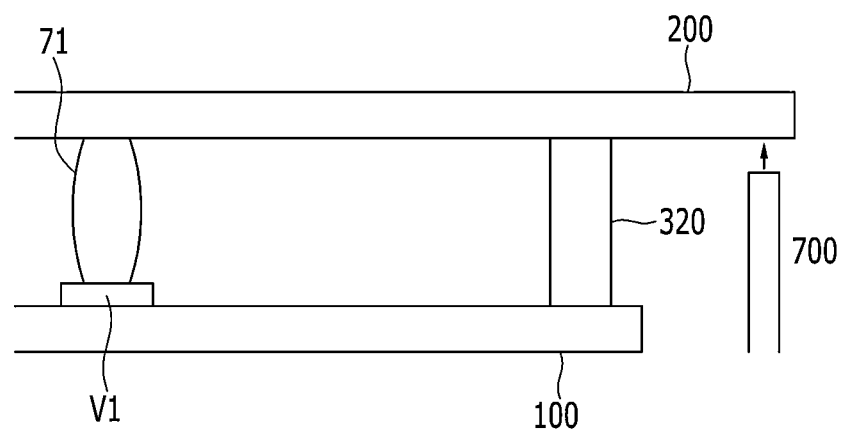
FIG. 9 is a cross-sectional view taken along line IX-IX of the mother substrate assembly of FIG. 2.

FIG. 9 is a cross-sectional view taken along line IX-IX of the mother substrate assembly of FIG. 2, showing a cross-section of the second region (region A2).

Referring to FIGS. 2 and 9, the common electrode driving line V1 is disposed outside the lower display panel, and the second spacer 71 is disposed on the common electrode driving line V1.

The second spacer 71 allows the common electrode driving line to contact the upper mother substrate.

Referring to FIG. 2, the common electrode driving line is connected to the common electrode driving line extension V1.

Next, the first and second regions, which are not covered by the lower mother substrate and are thereby exposed, are applied with the voltage to pretilt the liquid crystals.

Referring to FIGS. 8 and 9, a voltage applying probe 700 may be used to apply a pretilt voltage for the liquid crystals through the voltage applying unit P1 of the region A1 and the voltage applying unit P2 of the region A2.

However, the pretilt voltage may be directly applied to the upper mother substrate without going through the voltage applying units.

The voltages applied to the regions A1 and A2 may be different from each other.

In one exemplary embodiment, for example, the voltage applied to the region A1 may be a ground voltage e.g., about zero (0) volt (V), and the voltage applied to the region A2 may be about 9.5 V.

However, the voltages applied thereto may be variously modified based upon a type or size of the panel.

Referring to FIG. 8, the voltage applied to the region A1 is transmitted along the upper mother substrate.

Referring to FIG. 8, when the voltage is applied to the upper mother substrate 200 through the voltage applying probe 700, the applied voltage is transmitted to the data driving line D1 through the first spacer 70 that connects the upper mother substrate 200 with the lower mother substrate 100.

The data driving line D1 receives the voltage and then transmits the voltage to the data line of each pixel of the lower display panel 300.

In such an embodiment, referring to FIG. 9, the voltage applied to the region A2 is transmitted along the upper mother substrate.

Referring to FIG. 9, when the voltage is applied to the upper mother substrate 200 through the voltage applying probe 700, the applied voltage is transmitted to the common electrode of each upper display panel of the upper mother substrate 200.

In such an embodiment, as shown in FIG. 9, the voltage applied to the upper mother substrate is transmitted to the common voltage driving line V1 through the second spacer 71.

Referring to FIG. 2, the common voltage driving line V1 extends along an outer edge of the lower display panel, and is connected to the common voltage driving line extension V1 of the region A1.

Thus, the voltage applied to the region A2 of the upper mother substrate is transmitted to the common electrode and to the common voltage driving line extension through the second spacer 71.

Referring to FIGS. 2 and 6, the divided reference voltage driving line extension is connected to the common voltage driving line extension and the data driving line extension through the resistors.

The data driving line extension D1 receives the voltage applied to the region A1 through the first spacer 70.

The received voltage is transmitted to the divided reference voltage driving line extension through the resistor R2.

However, the common voltage driving line extension V1 receives the voltage applied to the region A2 through the second spacer 71.

The received voltage is transmitted to the divided reference voltage driving line extension through the resistor R1.

In the divided reference voltage driving line extension, a third voltage, which is different from the voltages applied to the regions A1 and A2, is generated.

In such an embodiment, three output voltages are generated by applying two input voltages to the mother substrate assembly.

Figure 7:
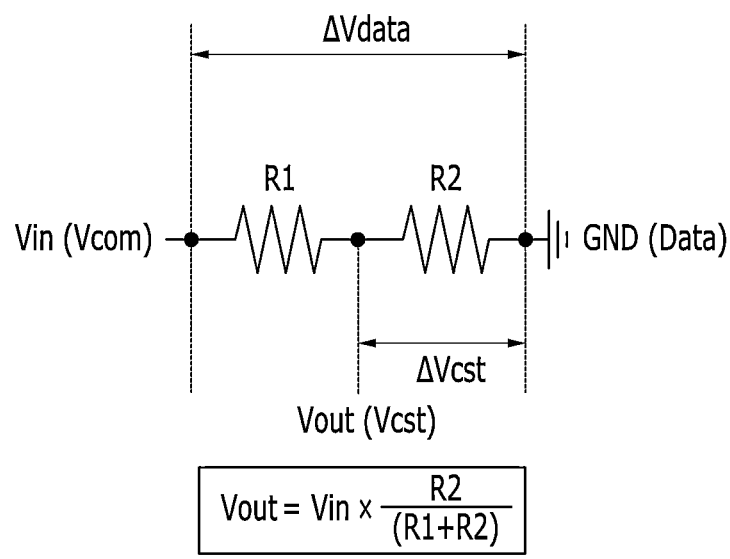
FIG. 7 is a circuit diagram showing an exemplary embodiment of an output voltage from a divided reference voltage driving line extension.

FIG. 7 is a circuit diagram showing a voltage output from the divided reference voltage driving line extension.

Referring to FIG. 7, a voltage outputted from the divided reference voltage driving line extension is substantially proportional to the relative resistances of the resistors R1 and R2 that are connected to opposing ends thereof.

Referring to FIG. 7, the voltage outputted from the divided reference voltage driving line extension satisfies the following equation:

$$V_{out} = *R_1/(R_1+R_2).$$

In the equation above, $V_{in}$ denotes a difference between the voltage applied to the region A1 and the voltage applied to the region A2.

In an exemplary embodiment of the invention, the voltage outputted from the divided reference voltage driving line extension differs from the voltages that are applied to the regions A1 and A2.

As shown in the equation, the voltage outputted from the divided reference voltage driving line extension is less than the voltage applied to the region A2.

As described above, the voltage outputted from the divided reference voltage driving line extension is transmitted to the divided reference voltage driving line of each pixel inside the display panel.

Thus, referring to FIG. 3, since a constant voltage Vcst_R or Vcst_L is applied to the divided reference voltage driving line RL, a first subpixel area PEa and a second subpixel area PEb may be charged with different voltages, respectively.

In such an embodiment, without an additional input terminal, two input voltages are used to generate three output voltages such that pretilts of the liquid crystals of the first and second subpixel areas may be effectively controlled.

In a conventional method of manufacturing a display device, two input voltages are applied to generate two output voltages such that the first and second subpixel areas are applied with the same voltage, and alignments of the liquid crystals are thereby substantially the same in the first and second subpixel areas. This may result in deteriorating side visibility.

Accordingly, three output voltages may be used (data voltage Data, common voltage Vcst_R or Vcst_L, and divided voltage reference line voltage) to differentiate the pretilts of the liquid crystals of the first and second subpixel areas and thus to improve the side visibility, and three input terminals are typically used to generate the three output voltages.

In an exemplary embodiment of the manufacturing method according to the invention, the divided reference voltage driving line extension of the mother substrate assembly, the common voltage extension, and the data driving line extension are respectively connected through the resistors such that the resistance difference therebetween is used to generate the third output voltage in the divided reference voltage driving line.

In such an embodiment, three output voltages are generated from two voltages applied to two input terminals, and the pretilts of the first and second subpixel areas are differently configured.

Next, the light is irradiated from above the upper mother substrate to harden the alignment aid.

When the alignment aid is a UV curing monomer, light such as ultraviolet rays may be irradiated to the liquid crystal layer.

As described above, the alignment aid may be included in at least one of the lower and upper alignment layers.

Alternatively, the alignment aid may be included in the liquid crystal mixture layer that is provided between the upper and lower display panels.

Figure 10:
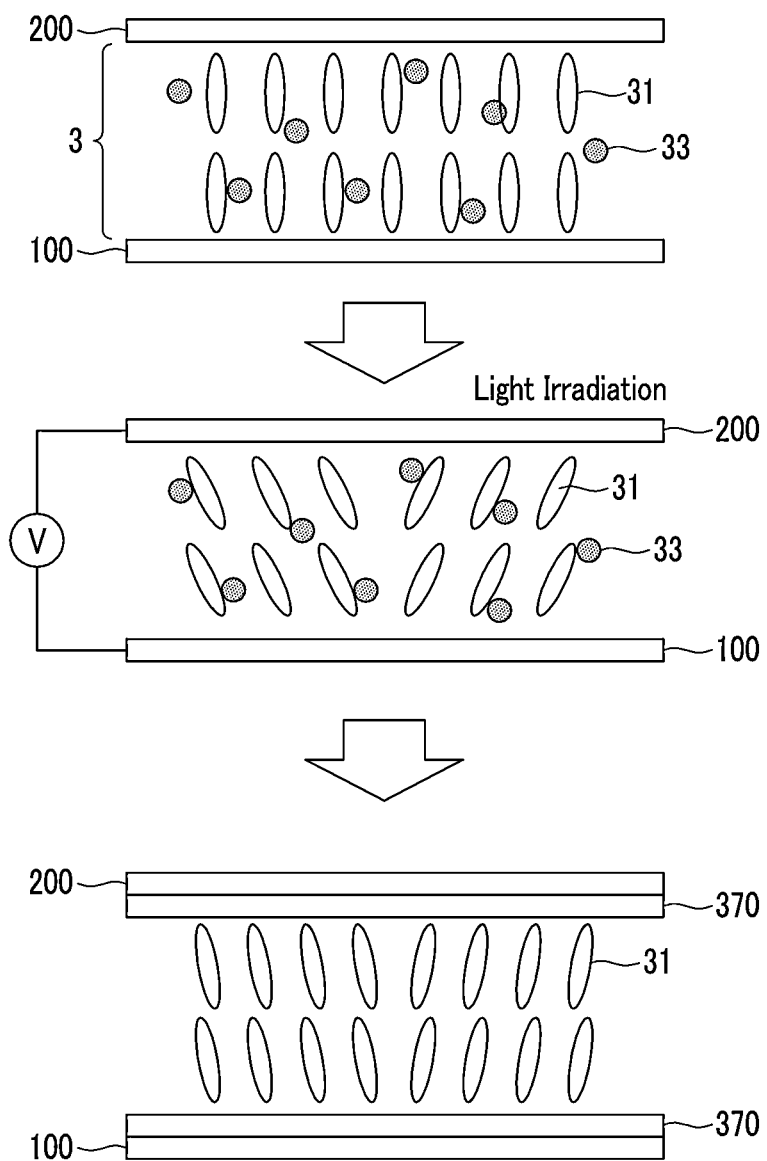
FIG. 10 is a diagram showing a voltage application process and a light irradiation process in an exemplary embodiment of a manufacturing process of a liquid crystal display according to the invention.

FIG. 10 is a diagram showing a voltage application process and a light irradiation process in an exemplary embodiment of a manufacturing process of a liquid crystal display according to the invention.

Referring to FIG. 10, the liquid crystal molecules 31 are aligned with predetermined pretilts, and the pretilts of the liquid crystal molecules 31 are maintained by irradiating light thereto.

In this case, the light irradiation may harden the alignment aid 33 to provide alignment layers 270 to maintain the pretilts.

As described above, in an exemplary embodiment of the manufacturing method of the liquid crystal display according to the invention, two input voltages are used to generate three output voltages.

Thus, the pretilts of the first and second subpixel areas are differently configured.

Figure 11A:
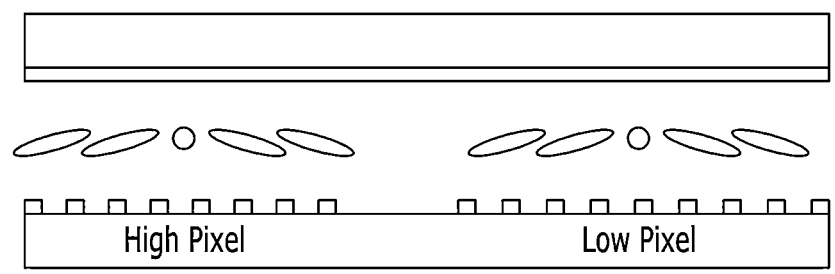
FIGS. 11A and 11B show pretilts of the liquid crystals in a conventional embodiment and in an exemplary embodiment of the invention, respectively.
Figure 11B:
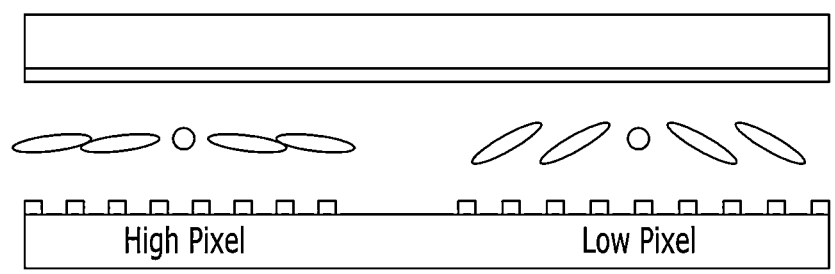

FIGS. 11A and 11B show the pretilts of the liquid crystals in a conventional liquid crystal display and in an exemplary embodiment of the invention.

FIG. 11A shows the pretilt of the liquid crystals in the comparative example of the invention.

As described above, when two input voltages are provided in the conventional liquid crystal display, the two voltages are applied only to the data line and the common electrode of the pixel, such that the pretilts of the first subpixel area (high gray) and the second subpixel area (low gray) are substantially the same as each other, as shown in FIG. 11A.

In an exemplary embodiment of the invention, as described above, the extensions (pads) of the respective driving lines are connected through the resistors, and two input voltages are used to generate three output voltages.

Thus, the data line, the divided reference voltage line, and the common electrode of each pixel are respectively applied with the voltages such that the voltages generated in the first subpixel area (high gray) and the second subpixel area (low gray) are different from each other.

Accordingly, the liquid crystals of the first subpixel area (high gray) that is unaffected by the voltage applied to the divided reference voltage line completely lie down (aligned substantially horizontally), while the liquid crystals of the second subpixel area (low gray) that is affected by the voltage applied to the divided reference voltage line lie down than the liquid crystals of the first subpixel area.

Accordingly, as shown in FIG. 11B, in an exemplary embodiment of the manufacturing method of the liquid crystal display according to the invention, the pretilts of the liquid crystals are differently configured in the high and low gray pixel areas.

As described above, when the low and high gray pixel areas are applied with the different voltages and are then irradiated by the light, the pretilts of the liquid crystals become different from each other, thereby improving side visibility compared with the case in which the low and high gray pixel areas are applied with the same voltage and are then irradiated by the light.

Improved properties of an exemplary embodiment of the liquid crystal display according to the invention will now be described in detail with reference to FIGS. 12 and 13.

Figure 12:
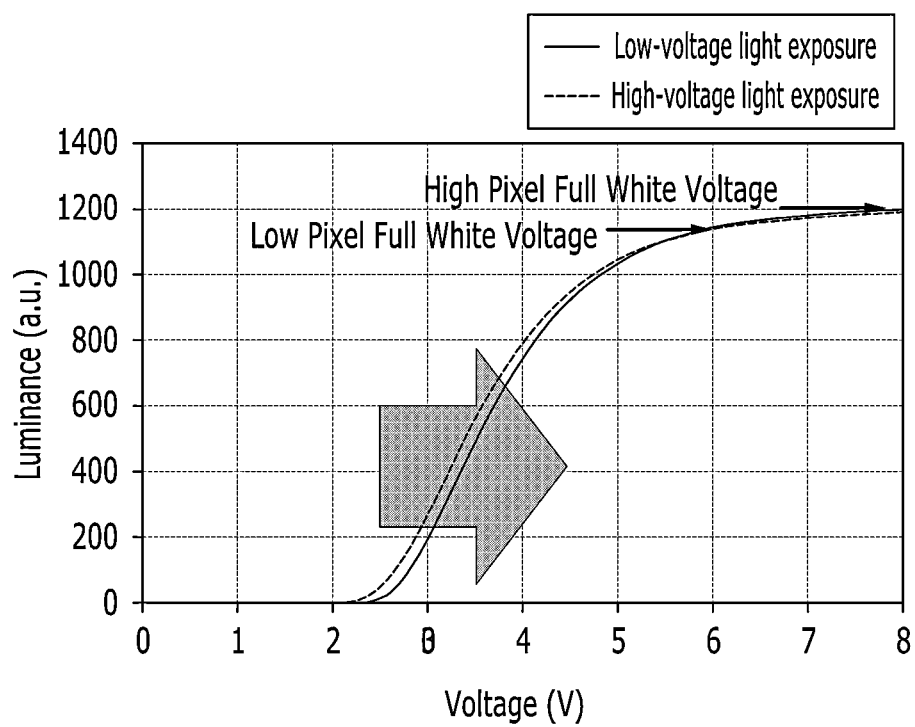
FIG. 12 shows luminance (arbitrary unit: a.u.) versus voltage (volt: V) when the liquid crystal display is irradiated by the light respectively at high and low voltages.

FIG. 12 shows luminance (arbitrary unit: a.u.) versus voltage (V) when the liquid crystal display is irradiated by the light respectively at high and low voltages.

Referring to FIG. 12, when applied with the same voltage, the liquid crystal display irradiated at the low voltage has brighter luminance than that irradiated at the high voltage.

Figure 13:
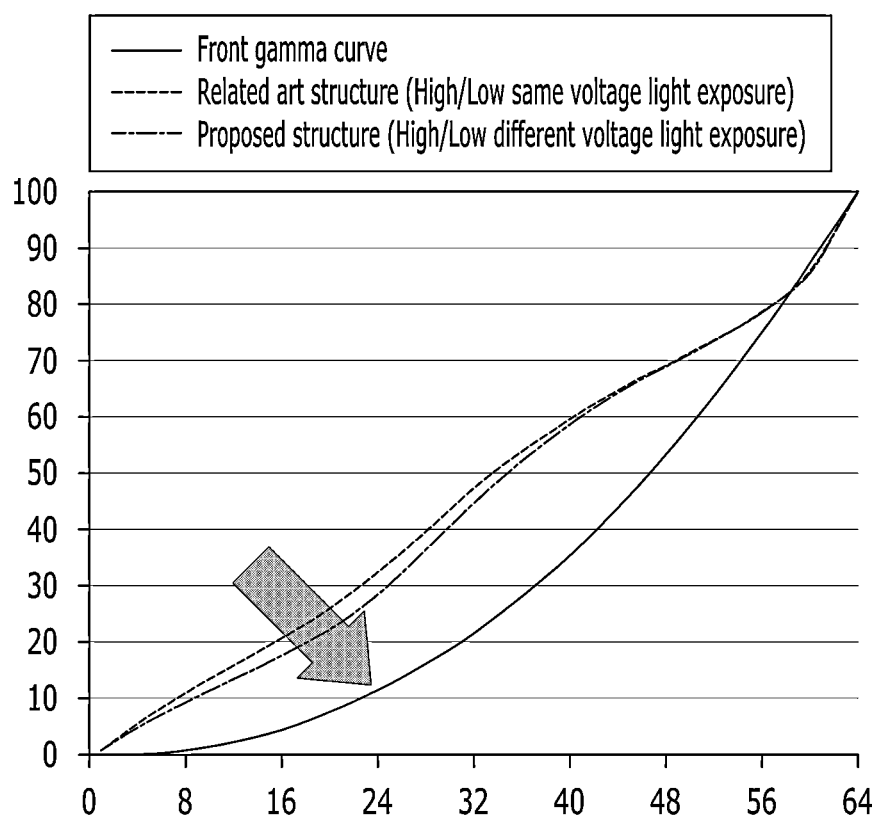
FIG. 13 shows gamma curves of the liquid crystal displays respectively manufactured by a conventional method and an exemplary embodiment of the invention.

FIG. 13 shows gamma curves of the liquid crystal displays respectively manufactured by a conventional method and an exemplary embodiment of a manufacturing method, as described herein, according to the invention.

Referring to FIG. 13, in the low gray region of the comparative example in which the high and low gray pixel electrodes are irradiated by light at the same voltage, a side gamma curve has a higher value than a front gamma curve.

Thus, a low gray image is recognized as being washed-out (i.e., brighter) when the liquid crystal display is seen from the side than when the liquid crystal display id seen from the front.

However, as shown in FIG. 13, an exemplary embodiment of the invention in which the high and low gray pixel electrodes are applied with the different voltages and are irradiated by the light, the side gamma curve becomes substantially closer to the front gamma curve.

Thus, in an exemplary embodiment of the liquid crystal display according to the invention, the wash-out phenomenon may be effectively prevented even in the low gray.

Figure 14:
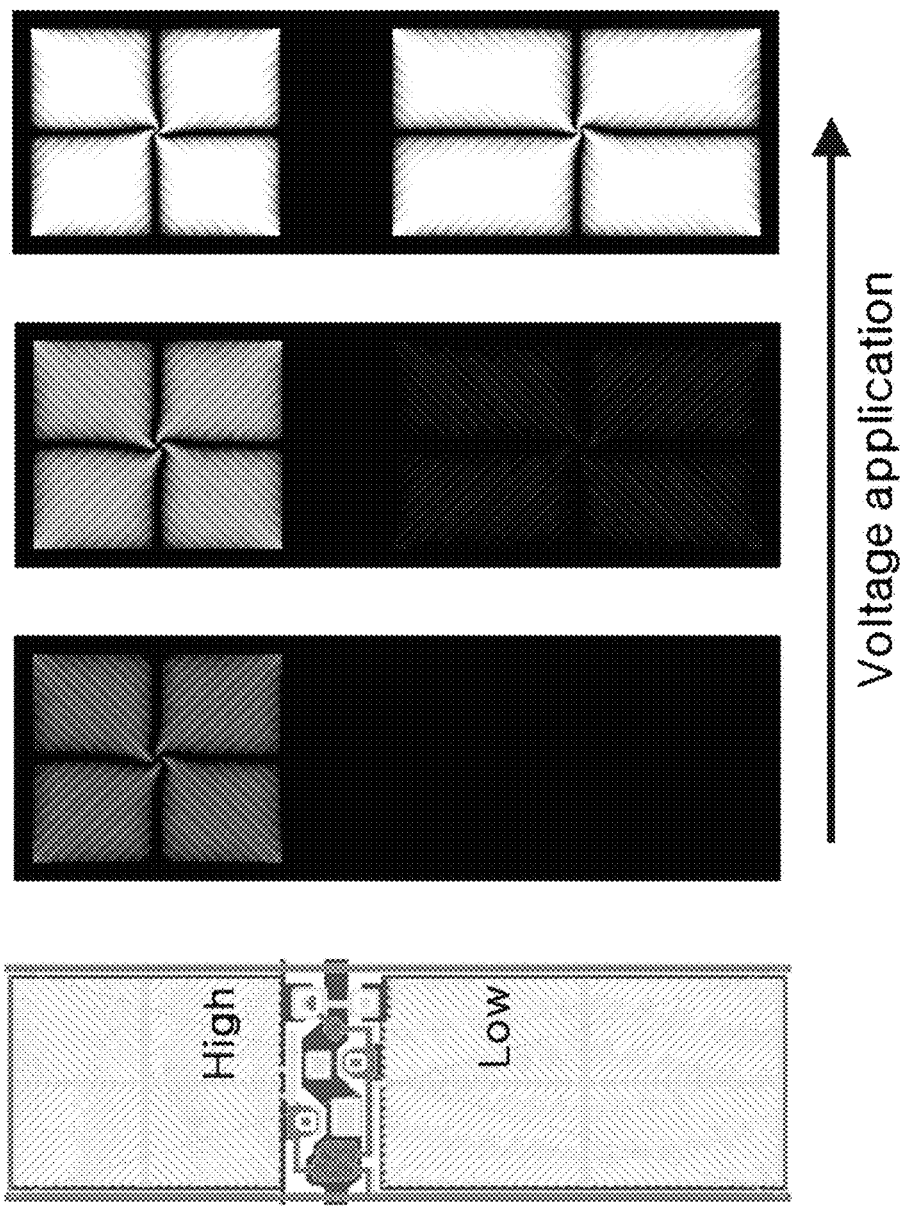
FIG. 14 shows images of the high and low gray pixel electrodes to which different voltages are applied in an exemplary embodiment of the manufacturing method of the liquid crystal display according to the invention.

FIG. 14 shows images of the high and low gray pixel electrodes to which different voltages are applied in an exemplary embodiment of the manufacturing method of the liquid crystal display according to the invention.

As shown in FIG. 14, in an exemplary embodiment of the liquid crystal display according to the invention, the high and low gray pixel electrodes may be respectively applied with the different voltages from each other in an irradiating process of the manufacturing process.

Thus, the pretilts of the liquid crystals of the high and low gray pixel electrodes may be differently configured to have different pretilts of the photo-aligned alignment layer.

Generally, three input voltages are used to apply the different voltages to the high and low gray pixel electrodes.

However, in an exemplary embodiment of the invention, the divided reference voltage driving line extension (Vcst pad), the data driving line extension (Data pad) and the common voltage driving line extension (Vcom pad) are connected through the resistors R1 and R2 such that three output voltages are generated through the resistors using only two input voltages.

In such an embodiment, the voltage outputted from the divided reference voltage driving line extension is determined by a ratio of resistance of the first resistor R1 to resistance with respect to the second resistor R2.

In an exemplary embodiment of the invention, the ratio of the resistance of the first resistor R1 to the second resistance of the resistor R2 may be in range of about 1:0.2 to about 0.5.

Figure 15:
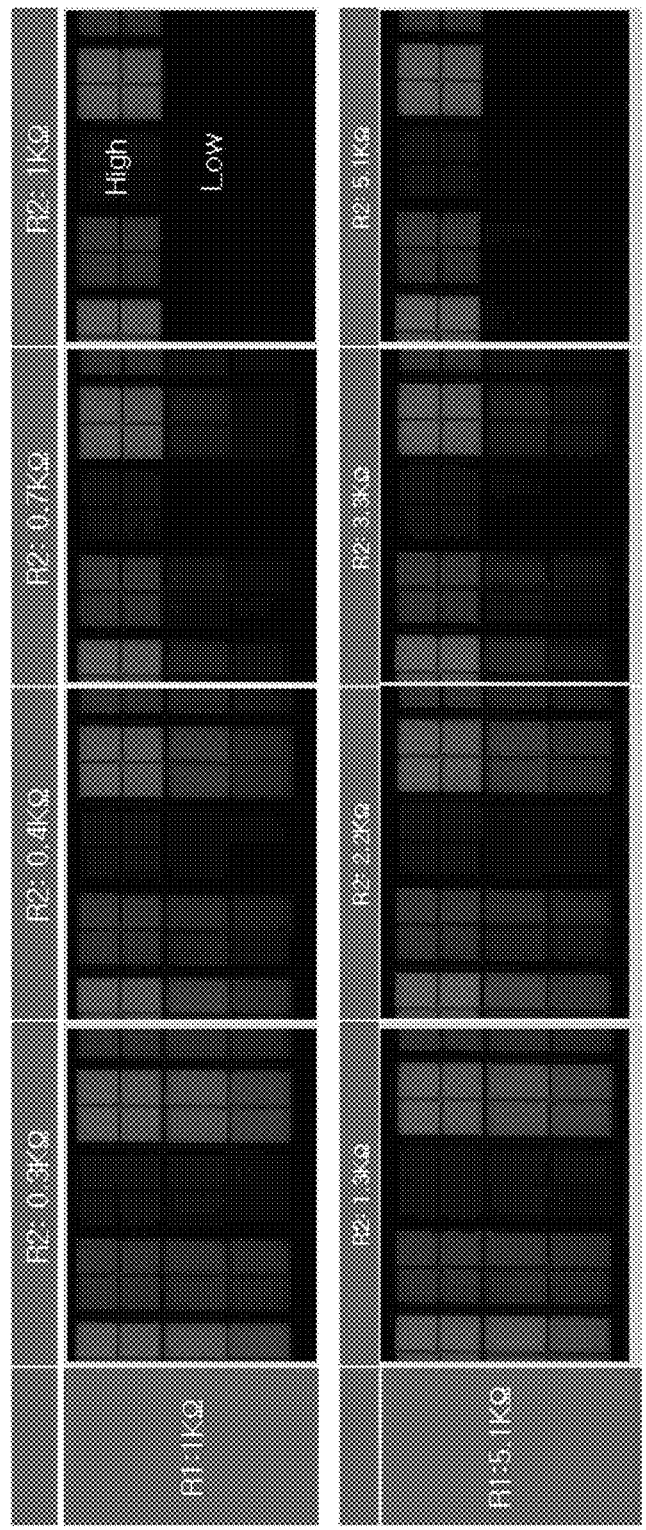
FIG. 15 shows experimental images of exemplary embodiments of the liquid crystal display according to the invention, while resistances R1 and R2 are varied.

FIG. 15 shows experimental images of exemplary embodiments of the liquid crystal display according to the invention in which the resistances of the resistors R1 and R2 are differently set for experimental purposes.

Referring to FIG. 15, the resistance of the first resistor R1 differs by less than 50% from the resistance of the second resistor R2, and the low gray pixel electrode region is substantially applied with a voltage corresponding to an on-voltage such that the low gray pixel electrode region is shown as black.

That is, when the ratio of the resistance of the first resistor R1 to the resistance to the second resistor R2 is greater than about 1:0.5, the low gray pixel electrode is substantially applied with no voltage such that the liquid crystals therein are effectively substantially pretilted.

Figure 16:
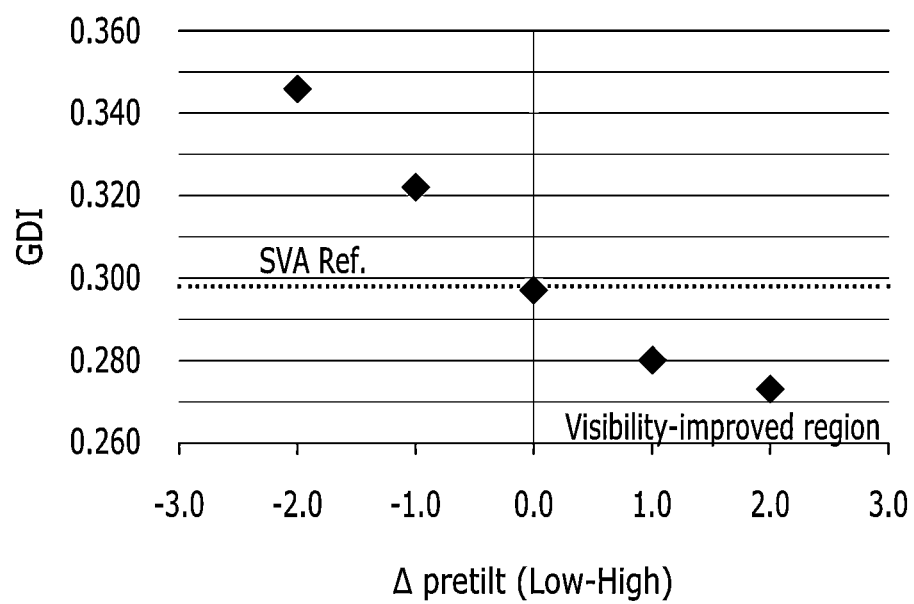
FIG. 16 shows a graph visibility index (GDI) versus difference between pretilt angles of the liquid crystal molecules in the low gray pixel electrode region and in the high gray pixel electrode region.

FIG. 16 shows a graph of visibility index (GDI) versus a difference between a pretilt angle of the liquid crystal molecules of the low gray pixel electrode region and a pretilt angle of the liquid crystal molecules of the high gray pixel electrode region.

The visibility index (GDI) is a quantified value representing a difference between the gamma curve at the front and the gamma curve at the side. The lower the GDI is, the more similar the front gamma curve is to the side gamma curve.

Accordingly, the lower the GDI is, the better the side visibility is.

Referring to FIG. 16, the greater the pretilt angle of the liquid crystals of the low gray pixel electrode is than the pretilt angle of the liquid crystals of the high gray pixel electrode, the more improved the side visibility is.

As shown in FIG. 16, the greater the pretilt angles of the liquid crystals of the low and high gray pixel electrode regions are, the more improved the side visibility is.

Referring back to FIG. 11B, in an exemplary embodiment of the invention, the liquid crystals of the high gray pixel electrode region are applied with a relatively higher voltage than the liquid crystals in the low gray pixel electrode region and thus the liquid crystals of the high gray pixel electrode region substantially completely lie down, but the liquid crystals in the low gray pixel electrode region are applied with a relatively lower voltage than the liquid crystals the high gray pixel electrode region and thus the liquid crystals in the low gray pixel electrode region do not completely lie down.

Thus, similar to as shown in FIG. 16, the pretilt angle of the low gray pixel electrode region is greater than the pretilt angle of the high gray pixel electrode region.

In a conventional liquid crystal display, where the pretilt angle of the liquid crystals of the high gray pixel electrode region is substantially the same as that of the low gray pixel electrode region (i.e., Δpretilt (low-high)=0), the GDI is high at about 0.300.

Figure 17:
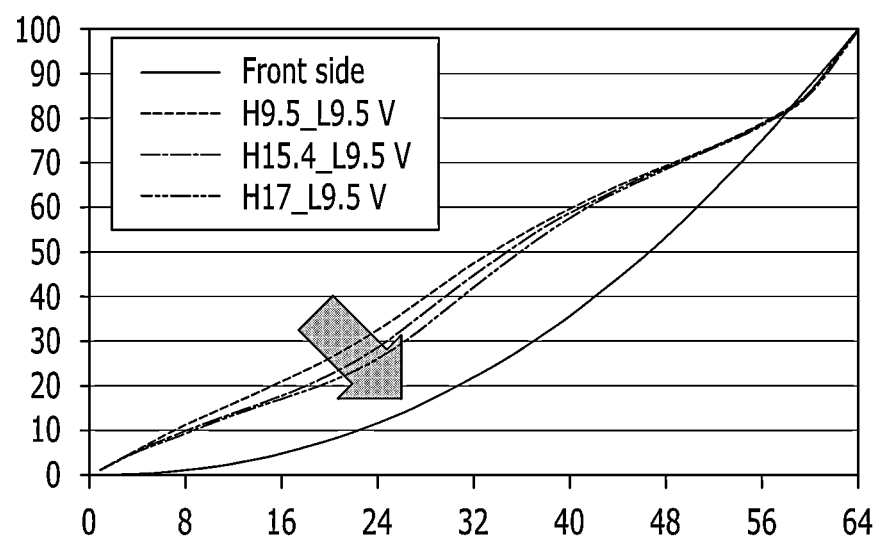
FIG. 17 shows gamma curves corresponding to voltages applied to the low and high gray pixel electrodes in a liquid crystal display.

FIG. 17 shows gamma curves corresponding to voltages applied to the low and high gray pixel electrodes in a liquid crystal display.

Referring to FIG. 17, when the high and low gray pixel electrodes are applied with the same voltage, the side gamma curve is farthest from the front gamma curve.

When about 15.4 V and about 9.5 V are respectively applied to the high and low gray pixel electrodes, as in an exemplary embodiment of the invention, the side gamma curve is closer to the front gamma curve.

Referring to FIG. 17, the greater the difference between the voltages applied to the high and low gray pixel electrodes is, the closer the side gamma curve is to the front gamma curve.

As described above, in an exemplary embodiment of the manufacturing method of the liquid crystal display according to the invention, two input voltages are used to generate three output voltages by connecting the divided reference voltage driving line extension (Vcst pad), the data driving line extension (Data pad), and the common voltage driving line extension (Vcom pad) through the first and second resistors R1 and R2.

Thus, the voltages applied to the high and low gray pixel electrodes of the liquid crystal display are different and thus the pretilt of the liquid crystals of each region are different from each other.

In a state in which liquid crystals are differently aligned as described above, the alignment aid is hardened by irradiating the light, thereby improving the side visibility of the liquid crystal display.

Hereinafter, another exemplary embodiment of a liquid crystal display according to the invention and an exemplary embodiment of a manufacturing method thereof will now be described with reference to FIGS. 18 and 19.

Figure 18:
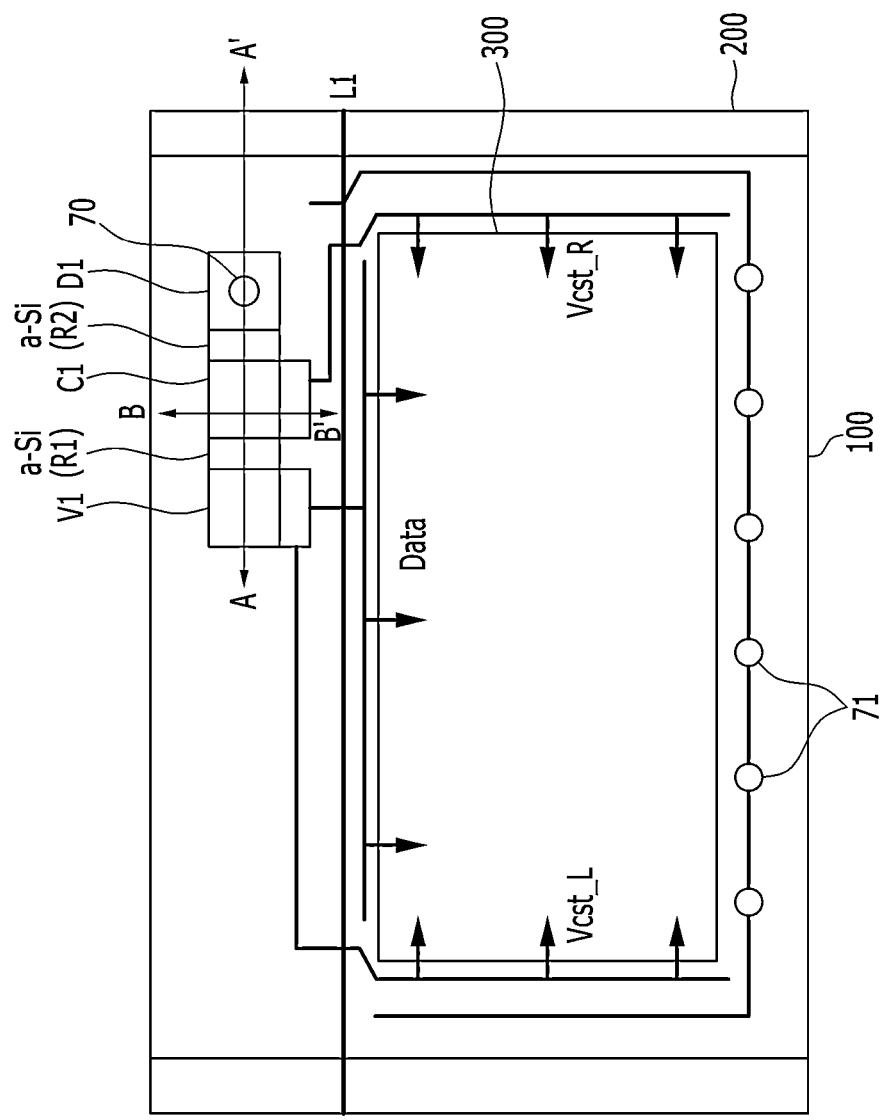
FIG. 18 is a block diagram showing an alternative exemplary embodiment of a mother substrate assembly according to the invention.

FIG. 18 is a drawing of to another exemplary embodiment of a mother substrate assembly according the invention.

Figure 19A:
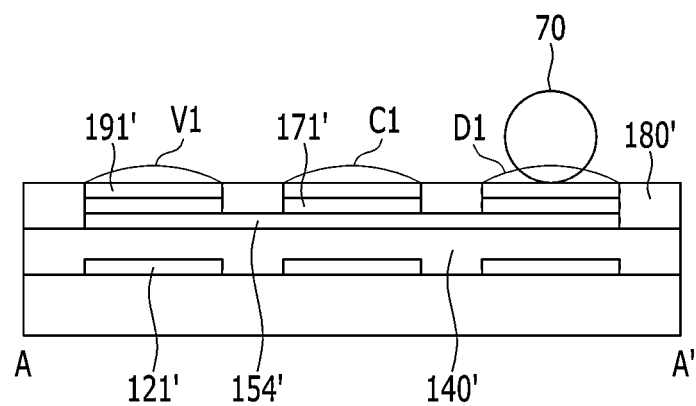
FIGS. 19A and 19B is a cross-sectional view taken along lines A-A" of the mother substrate assembly of FIG. 18.
Figure 19B:
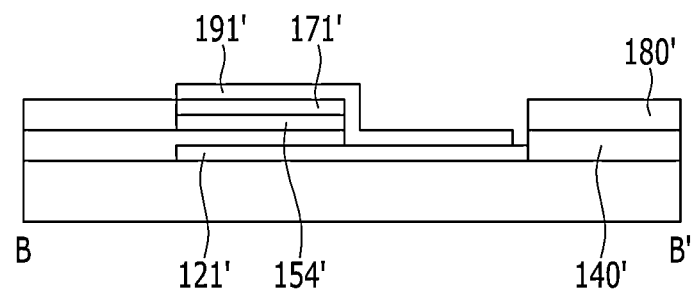

FIG. 19A shows a cross-sectional view taken along line A-A" of the mother substrate assembly of FIG. 18, and FIG. 19B shows a cross-sectional view taken along line B-B' of the mother substrate assembly of FIG. 18.

The liquid crystal display and the manufacturing method thereof in FIGS. 18 to 19B is substantially the same as the liquid crystal display and the manufacturing method thereof shown in FIGS. 2 to 9 except for the resistors R1 and R2 for connecting the divided reference voltage driving line extension, the data driving line extension and the common voltage driving line extension. The same or like elements shown in FIGS. 18 to 19B have been labeled with the same reference characters as used above to describe the exemplary embodiments of the liquid crystal display and the manufacturing method thereof shown in FIGS. 2 to 9, and any repetitive detailed description thereof will hereinafter be omitted or simplified.

In an exemplary embodiment, the resistors R1 and R2 for connecting the divided reference voltage driving line extension (Vcst pad), the data driving line extension (Data pad), and the common voltage driving line extension (Vcom pad) may include or be formed of the same material as the semiconductor layer of the liquid crystal display.

In an exemplary embodiment, as described above, the resistors R1 and R2 may include the same material as the pixel electrode, e.g., the IZO wire. In alternative exemplary embodiment, a semiconductor layer 154' is elongated such that portions thereof define the resistors R1 and R2.

In an exemplary embodiment, a semiconductor may be formed of n+ hydrogenated amorphous silicon in which an n-type impurity such as phosphorus is highly doped.

The semiconductor layer, functioning as the resistor by connecting the respective pads, may be formed in the same process when forming the semiconductor layer during the manufacturing process of the liquid crystal display.

FIG. 19A shows a cross-sectional view taken along line A-A" of the mother substrate assembly of FIG. 18.

Referring to FIG. 19A, the driving line pads V1, C1 and D1, and the resistors R1 and R2 may be simultaneously provided, e.g., formed, in the manufacturing process of the liquid crystal display.

Referring to FIG. 19A, a layer 121' formed of the same material as the gate conductor may be respectively provided at bottoms of the driving line pads V1, C1 and D1.

A layer 140' formed of the same material as the gate insulating layer is formed on the layer 121', and a layer 154' formed of the same material as the semiconductor layer may be formed on the layer 140'.

In an exemplary embodiment, the gate conductor layers 121' include three pads spaced apart from each other in a horizontal direction by sizes of the respective pads via a layer 180' formed of the same material as the passivation layer.

In such an embodiment, the gate insulating layer 140' is disposed over the three pads 121', and the semiconductor layer 154' is provided on the gate insulating layer 140' overlapping the three pads 121'.

Thus, the driving line extensions V1, C1 and D1 are connected to each other through the semiconductor layer, and the semiconductor layer 154' functions as a resistor.

By controlling a width or length of the semiconductor layer, the resistors R1 and R2 may be differently configured.

When the length of the semiconductor layer is shortened or the width thereof is increased, the resistance is decreased, and otherwise, the resistance is increased.

As described above, in an exemplary embodiment of the invention, the first resistor R1 that connects the common voltage driving line extension V1 to the divided reference voltage driving line extension C1 must be greater than the second resistor R2 that connects the divided reference voltage driving line extension C1 to the data driving line extension D1.

In such an embodiment, a ratio of the resistance of the first resistor R1 to the resistance of the second resistor R2 may be in a range of about 1:0.2 to about 1:0.5.

In an exemplary embodiment, the width of the semiconductor layer defining the first resistor R1 may be smaller than that of the semiconductor layer defining the second resistor R2.

In such an embodiment, the length of the semiconductor layer defining the first resistor R1 may be longer than that of the semiconductor layer defining the second resistor R2.

In such an embodiment, the width of the semiconductor layer defining the first resistor R1 may be smaller than that of the semiconductor layer defining the second resistor R2, and the length of the semiconductor layer defining the first resistor R1 may be longer than that of the semiconductor layer defining the second resistor R2.

A shape of the semiconductor layer, which functions as a resistor, may be provided in a predetermined configuration by patterning during a process of providing the semiconductor layer.

Thus, in such an embodiment, the resistance of the resistor R1 or R2 may be effectively controlled based on the width and the length of the semiconductor layer.

A layer 171' formed of the same material as the data conductor may be provided on the semiconductor layer 154' that functions as the resistor, and a layer 191' formed of the same material as the pixel electrode may be provided on the layer 171' formed of the same material as the data conductor.

Referring to FIG. 19B, the layer 191' formed of the same material as the pixel electrode may contact the gate conductor layer 121'.

In one exemplary embodiment of the invention, for example, the layer 121' may have a double layer structure including titanium and copper.

In such an embodiment, the layer 140' formed of the same material as the gate insulating layer may include g-SiNx.

In such an embodiment, the layer 154' formed of the same material as the semiconductor layer may include n+ hydrogenated amorphous silicon in which an n-type impurity is highly doped, and the layer 171' may have a triple layer structure including molybdenum, aluminum and molybdenum.

In such an embodiment, the layer 191' formed of the same material as the pixel electrode may include IZO.

In an exemplary embodiment of the liquid crystal display according to and an exemplary embodiment of the manufacturing method thereof, the resistors R1 and R2 are formed of a semiconductor material, and the width or length of the semiconductor layer is controlled to adjust the resistance thereof.

Thus, in such an embodiment, two input voltage may be used to generate three output voltages such that the voltages applied to the high and low gray subpixel electrodes are different in each pixel that is provided inside the liquid crystal display.

Accordingly, the pretilts of the liquid crystals are different in the high and low gray subpixel electrode regions and thus the liquid crystals in the high and low gray subpixel electrode regions are differently pretilted during the irradiation and photo-aligning processes, thereby improving the side visibility of the liquid crystal display, as in the exemplary embodiments described above.

Next, referring to FIGS. 20 to 24, another exemplary embodiment of the liquid crystal display according to the invention will be described.

In exemplary embodiments, the liquid crystal display may have a divided pixel structure as described above.

In such embodiments, the pixel electrode having the divided pixel structure based on the gate line extending in a horizontal direction, in which the high gray pixel electrode is disposed under the gate line and the low gray pixel electrode is disposed above the gate line when viewed from a top plan view.

However, in an alternative exemplary embodiment of the invention, any vertical alignment ("VA") mode liquid crystal display having a pixel structure including the high and low gray pixel electrodes to improve the side visibility may be manufactured using an exemplary embodiment of the manufacturing method herein.

That is, as described above, a VA mode liquid crystal display may include a structure in which the high and low gray pixel electrodes are separated or a structure in which the high and low gray pixel electrodes are integrally formed.

A structure of the pixel electrode in an alternative exemplary embodiment will now be described. However, the invention is not limited to a pixel structure of such an embodiment described herein. That is, an exemplary embodiment of a liquid crystal display may have any VA mode pixel structure including the high and low gray pixel electrodes to improve the side visibility without limitation.

Figure 20:
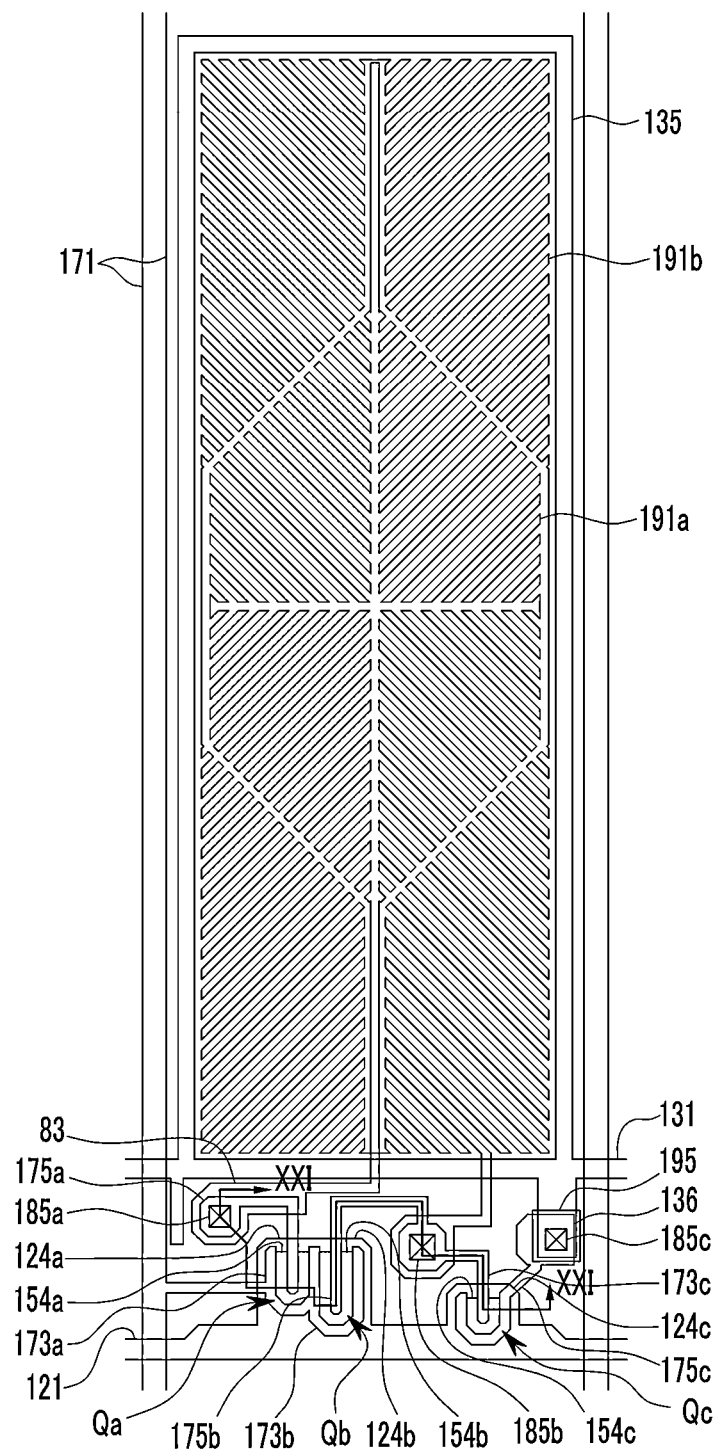
FIG. 20 is a plan view of a pixel of an exemplary embodiment of a liquid crystal display according to the invention.

FIG. 20 is a plan view of a pixel of an alternative exemplary embodiment of a liquid crystal display according to the invention.

Figure 21:
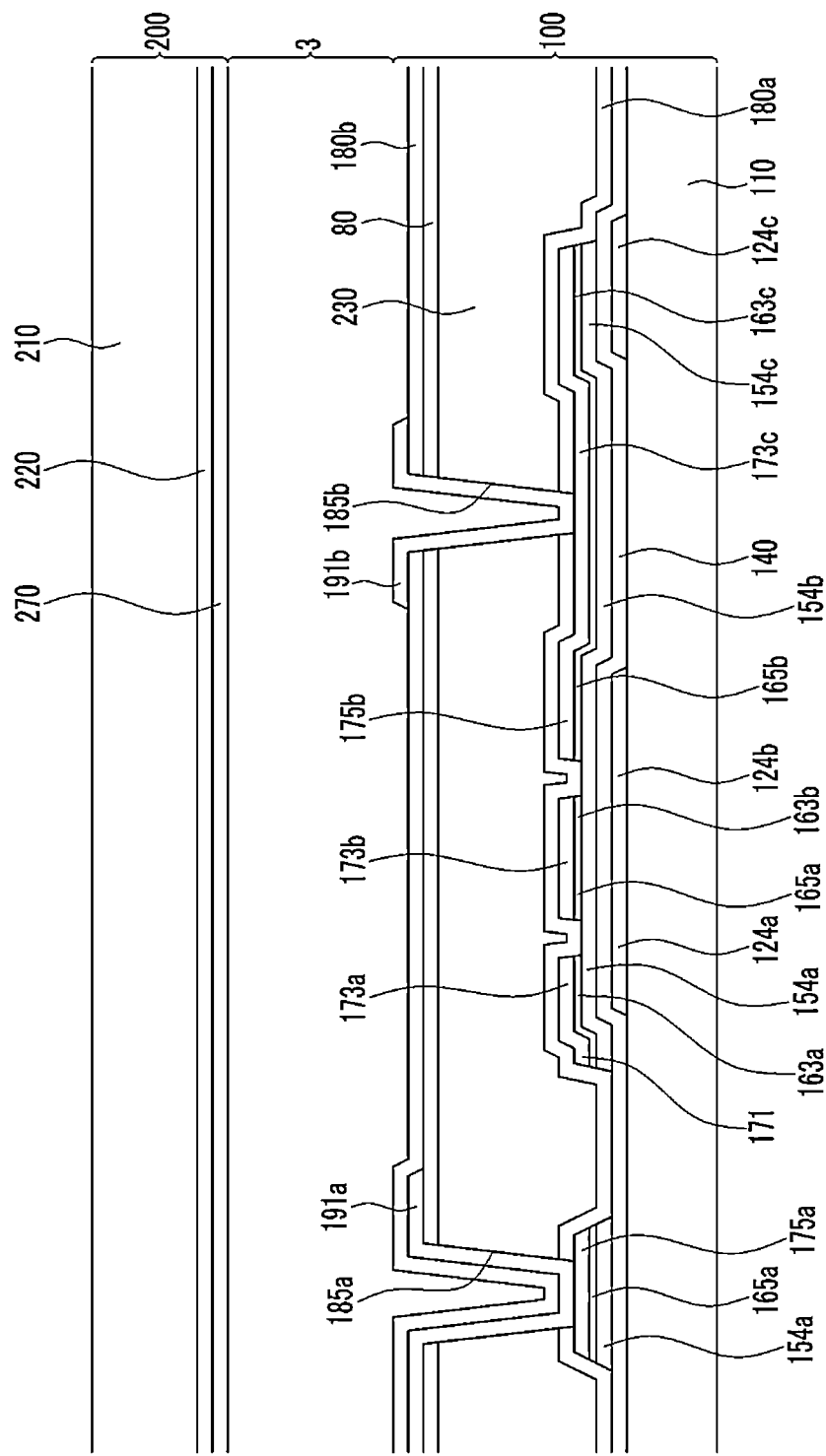
FIG. 21 is a cross-sectional view taken along line XXI-XXI of the liquid crystal display of FIG. 20.

FIG. 21 is a cross-sectional view taken along line XXI-XXI of the liquid crystal display of FIG. 20.

First, the lower display panel 100 will be described.

In an exemplary embodiment, as shown in FIGS. 20 and 21, the lower display panel 100 includes the first insulation substrate 110 including a transparent material such as glass or plastic, for example, and the lower display panel 100 further includes a gate line 121, a reference voltage line 131 and a storage electrode 135, which are disposed on the first insulation substrate 110.

The gate line 121 extends substantially in a horizontal direction to transmit gate signals.

The gate line 121 includes a first gate electrode 124a, a second gate electrode 124b, a third gate electrode 124c, and a wide end portion (not shown) for connection with other layers, or with an external driving circuit.

The reference voltage line 131 may extend substantially parallel to the gate line 121 and includes an extension 136, and the extension 136 is connected to a third drain electrode 175c that will be described later.

The reference voltage line 131 includes the storage electrode 135 that surrounds the pixel area.

A gate insulating layer 140 is disposed on the gate line 121, the reference voltage line 131 and the storage electrode 135.

A first semiconductor 154a, a second semiconductor 154b and a third semiconductor 154c that may be formed of amorphous or crystalline silicon are disposed on the gate insulating layer 140.

A plurality of ohmic contacts 163a, 163b, 163c, 165a and 165b are formed on the first semiconductor 154a, the second semiconductor 154b, and the third semiconductor 154c.

In an exemplary embodiment, where the semiconductors 154a, 154b and 154c include oxide semiconductors, the ohmic contacts may be omitted.

The data line 171 including data conductors 173a, 173b 173c, 175a, 175b and 175c including a first source electrode 173a, a second source electrode 173b, a first drain electrode 175a, a second drain electrode 175b, a third source electrode 173c and the third drain electrode 175c are disposed on the ohmic contacts 163a, 163b, 163c, 165a and 165b and the gate insulating layer 140.

The second drain electrode 175b is connected to the third source electrode 173c.

The first gate electrode 124a, the first source electrode 173a and the first drain electrode 175a collectively define a first thin film transistor Qa together with the first semiconductor 154a, and a channel of the thin film transistor is formed in the semiconductor 154a between the first source electrode 173a and the first drain electrode 175a.

Similarly, the second gate electrode 124b, the second source electrode 173b, and the second drain electrode 175b collectively define a second thin film transistor Qb together with the second semiconductor 154b, and a channel of the thin film transistor is formed in the semiconductor 154b between the second source electrode 173b and the second drain electrode 175b, while the third gate electrode 124c, the third source electrode 173c and the third drain electrode 175c collectively define a third thin film transistor Qc together with the semiconductor 154c, and a channel of the thin film transistor is formed in the semiconductor 154c between the third source electrode 173c and the third drain electrode 175c.

A first passivation layer 180a, which may be formed of an inorganic insulator such as a silicon nitride or a silicon oxide, for example, is disposed on the data conductors 171, 173a, 173b 173c, 175a, 175b and 175c and exposed portions of the semiconductors 154a, 154b and 154c.

A color filter 230 is disposed on the first passivation layer 180a.

A light blocking member (not shown) may be disposed on regions where the color filter 230 is not disposed and on a part of the color filter 230.

The light blocking member is also referred to as a black matrix, which effectively prevents light leakage.

A capping layer 80 is disposed on the color filter 230.

The capping layer 80 may effectively prevent the color filter 230 from lifting, suppress contamination of the liquid crystal layer due to an organic material such as a solvent coming from the color filter 230, and effectively prevent defects such as an afterimage when a screen is driven.

A first subpixel electrode 191a is disposed on the capping layer 80.

Referring to FIG. 20, the first subpixel electrode 191a includes a cross-shaped stem portion disposed at a central region of the pixel area, and a plurality of first branch electrodes extending from the cross-shaped branch portion.

The first branch electrodes extend in four directions.

The first branch electrodes may form a planar shape including four trapezoids that surrounds the cross-shaped connection portion.

A second passivation layer 180b is disposed on the capping layer 80 and the first subpixel electrode 191a.

A second subpixel electrode 191b is disposed on the second passivation layer 180b.

The second subpixel electrode 191b surrounds the first subpixel electrode 191a.

The second subpixel electrode 191b is formed as a square, an opening s define din a central portion of the second subpixel electrode 191b in a hexagonal shape.

The second subpixel electrode 191b includes second branch electrodes extending toward a center thereof from respective edges of the square.

The second branch electrodes may form four trapezoids corresponding to the trapezoids of the first subpixel electrode.

The first and second subpixel electrodes 191a and 191b may include or be formed of a transparent material such as ITO, IZO, etc.

The first and second subpixel electrodes 191a and 191b may include or be formed of a transparent conductive material such as ITO or IZO, or a reflective metal such as aluminum, silver, chromium, or an alloy thereof.

A first contact hole 185a is defined through the first passivation layer 180a and the capping layer 80 to partially expose the first drain electrode 175a, and a second contact hole 185b is defined through the first passivation layer 180a, the capping layer 80, and the second passivation layer 180b to partially expose the second drain electrode 175b. In such an embodiment, a third contact hole 185c is provided for a connection between the extension 136 and the third drain electrode 175c.

The first subpixel electrode 191a is physically and electrically connected to the first drain electrode 175a through the first contact hole 185a, and the second subpixel electrode 191b is physically and electrically connected to the second drain electrode 175b through the second contact hole 185b.

The first and second subpixel electrodes 191a and 191b are applied with a data voltage from the first and second drain electrodes 175a and 175b through the first and second contact holes 185a and 185b, respectively.

In such an embodiment, the data voltage applied to the second drain electrode 175b is partially divided by the third source electrode 173c such that a voltage applied to the first subpixel electrode 191a is greater than that applied to the second subpixel electrode 191b.

The first and second subpixel electrodes 191a and 191b applied with the data voltage generate an electric field together with a common electrode 270 of the upper display panel to determine directions of liquid crystal molecules of the liquid crystal layer 3 between the pixel and common electrodes 191 and 270.

In such an embodiment, luminance of light passing through the liquid crystal layer 3 may be controlled based on the determined directions of the liquid crystal molecules.

A lower alignment layer (not shown) is disposed on the first and second subpixel electrodes 191a and 191b.

The lower alignment layer may be a vertical alignment layer or a horizontal alignment layer.

The lower alignment layer may include an alignment aid for initial alignment of liquid crystals.

The alignment aid may be a reactive monomer, and for example, may include an UV curing monomer.

In such an embodiment, the lower alignment layer may further include a UV curing initiator.

In one exemplary embodiment, for example, the UV curing monomer may be an acrylate monomer, and a UV curing initiator may be formed of a material that can absorb light of a UV wavelength, such as 2,2-dimethoxy-1,2-diphenyl ethanone.

The upper display panel 200 will now be described.

The upper display panel 200 may include a second insulation substrate 210 including a transparent material such as glass or plastic, for example, and a light blocking member disposed on the second insulation substrate 210.

A common electrode may be disposed on the light blocking member 220.

The upper display panel may include an upper alignment layer disposed on the common electrode.

The upper alignment layer may be a vertical alignment layer or a horizontal alignment layer.

The upper alignment layer may include an alignment aid for initial alignment of the liquid crystals.

The alignment aid may be a reactive monomer, and for example, may include an UV curing monomer.

In such an embodiment, the lower alignment layer may further include a UV curing initiator.

In one exemplary embodiment, for example, the UV curing monomer may be an acrylate monomer, and a UV curing initiator may be formed of a material that can absorb light of a UV wavelength, such as 2,2-dimethoxy-1,2-diphenyl ethanone.

Figure 22:
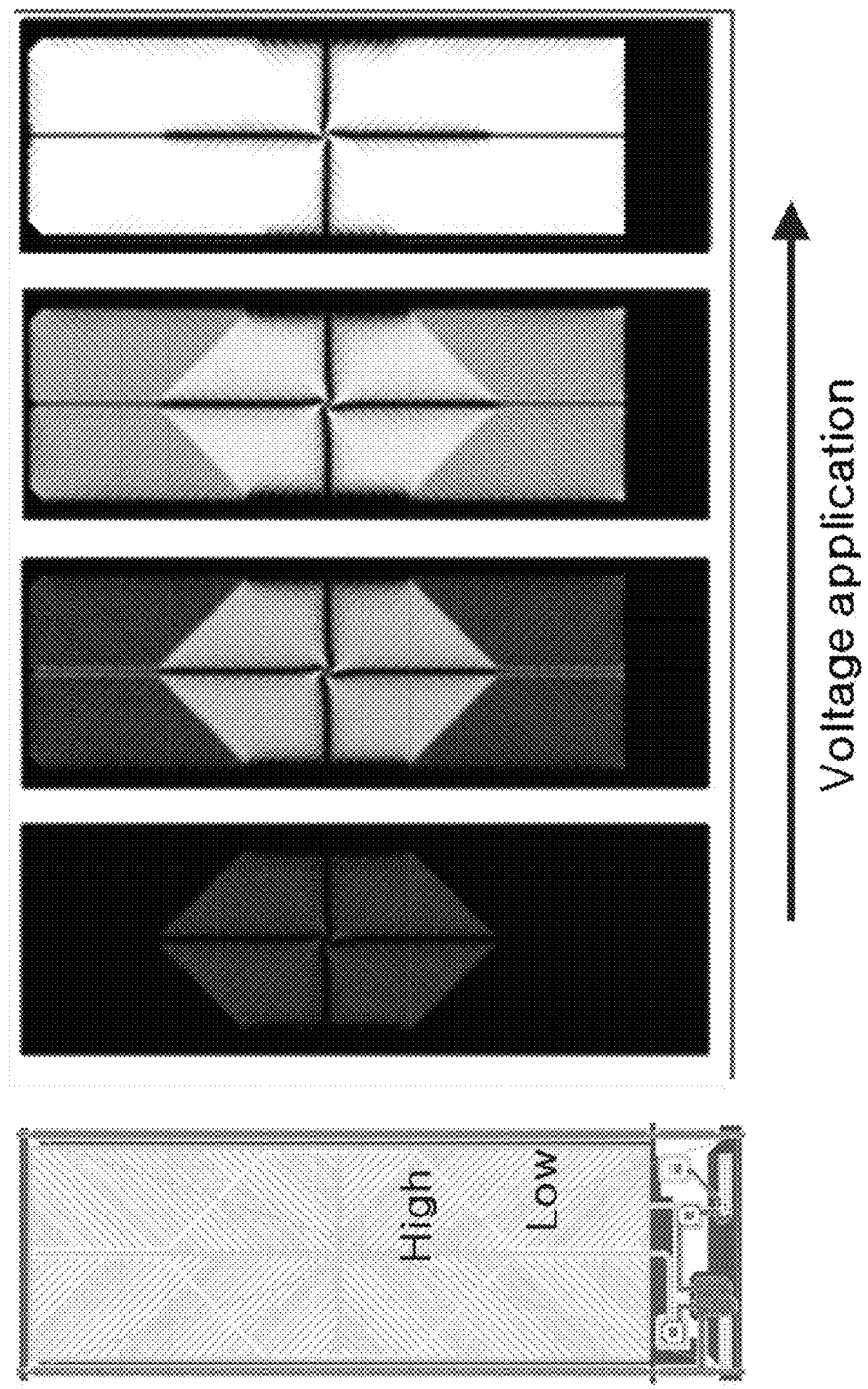
FIG. 22 shows images of a liquid crystal display having a pixel structure manufactured by an exemplary embodiment of a method in which different voltages are applied to high and low gray pixel electrodes.

FIG. 22 shows images of the liquid crystal display having a pixel structure shown in FIG. 20 in which different voltages are applied to high and low gray pixel electrodes.

As shown in FIG. 22, in an exemplary embodiment of the liquid crystal display according to the invention, different voltages may be applied to the high and low gray pixel electrodes in an irradiating process in the manufacturing process.

Thus, the pretilts of the liquid crystals of the high and low gray pixel electrodes are different so as to differently form the pretilts of the photo-aligned alignment layer.

Now, a structure of a pixel of another alternative exemplary embodiment of a liquid crystal display according to the invention will be described with reference to FIGS. 23 and 24.

Figure 23:
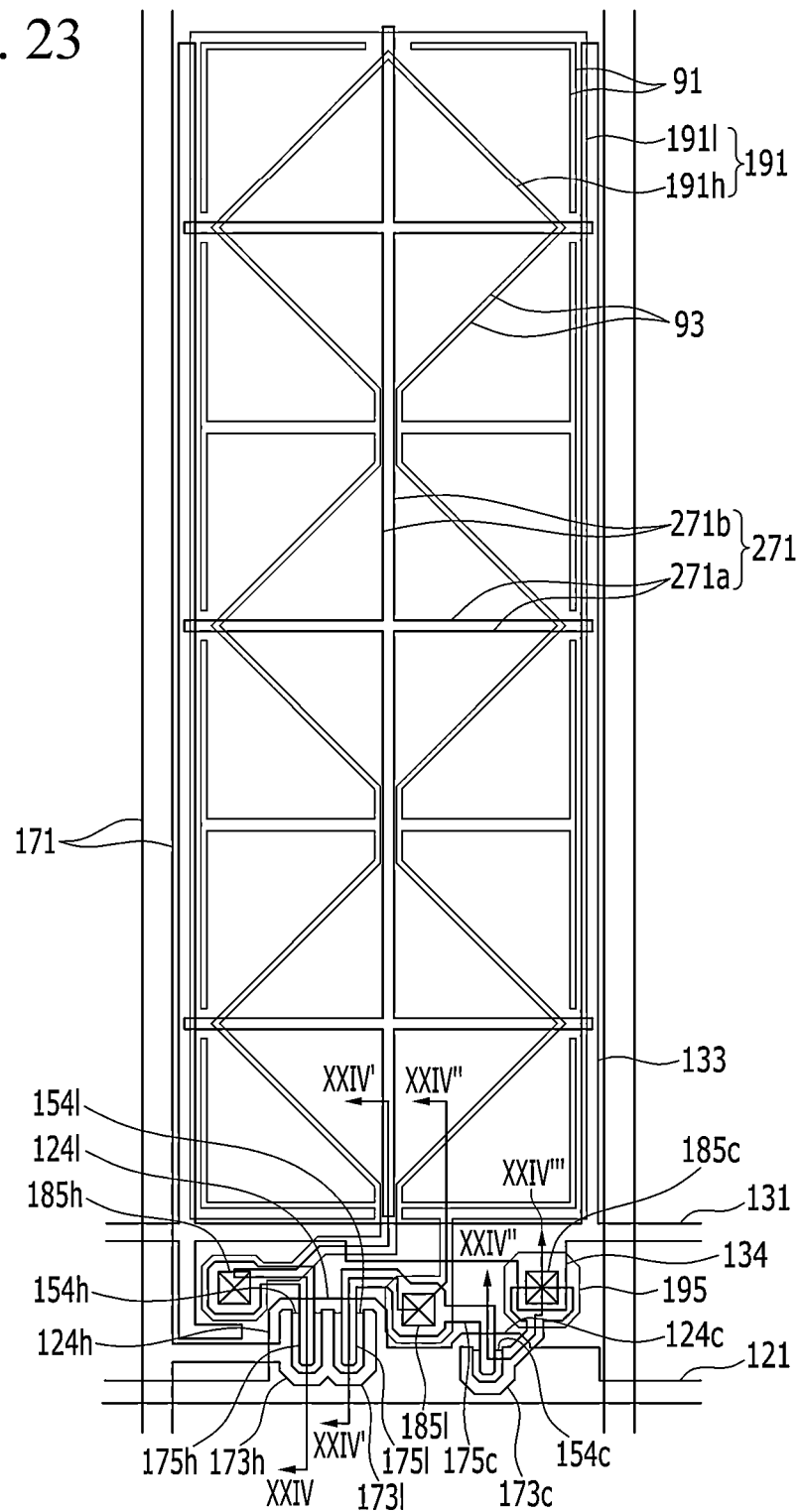
FIG. 23 is a plan view of a pixel of an exemplary embodiment of a liquid crystal display according to the invention.

FIG. 23 is a top plan view of a pixel of another alternative exemplary embodiment of a liquid crystal display according to the invention.

Figure 24:
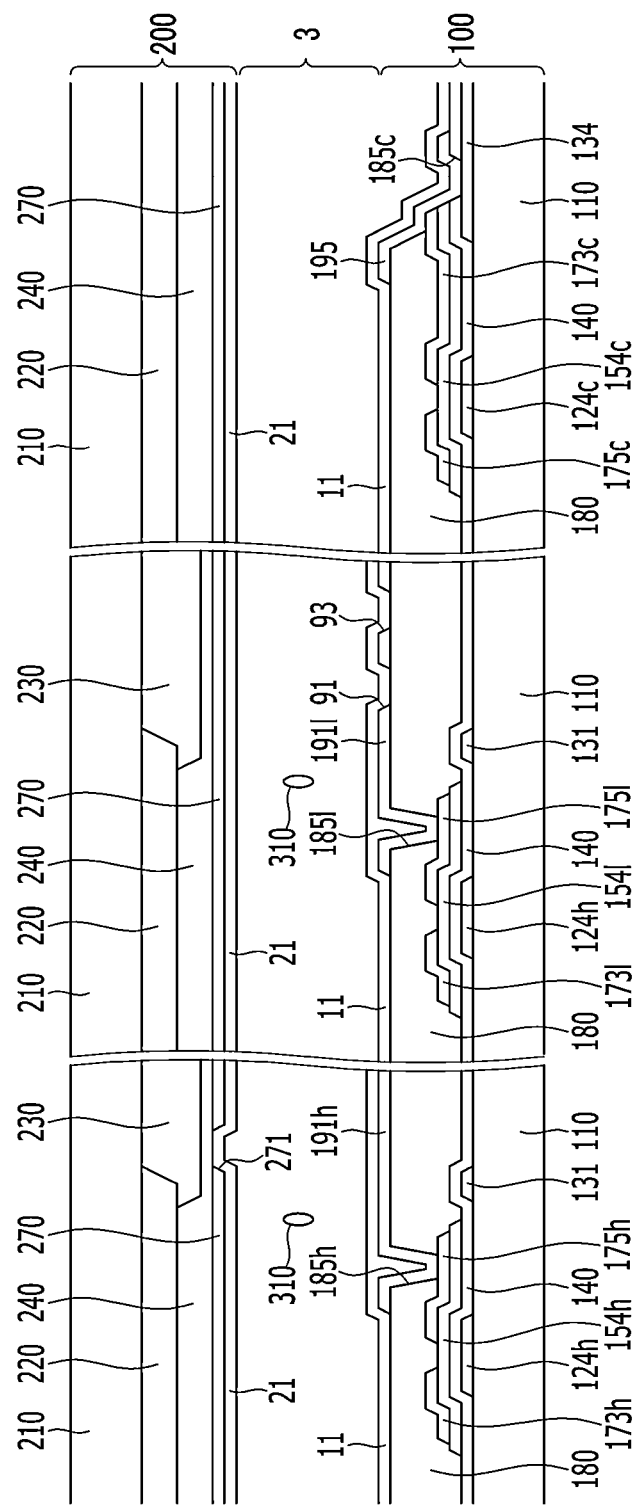
FIG. 24 shows cross-sectional views taken along lines XXIV-XXIV', XXIV'-XXIV", and XXIV"-XXIV'" of the liquid crystal display of FIG. 23.

FIG. 24 shows cross-sectional views taken along lines XXIV-XXIV', XXIV'-XXIV'', and XXIV''-XXIV''' of the liquid crystal display of FIG. 23.

As shown in FIGS. 23 and 24, an exemplary embodiment of the liquid crystal display according to the invention includes a lower display panel 100 and an upper display panel 200 facing each other, and a liquid crystal layer 3 interposed between the lower and upper display panels 100 and 200.

First, the lower display panel 100 will be described.

In an exemplary embodiment, the lower display panel 100 includes a first insulation substrate 110 formed of transparent glass or plastic, and further includes a gate line 121 and a storage electrode line 131 disposed in a predetermined direction on the first insulation substrate 110.

The gate line 121 extends substantially in a horizontal direction to transmit gate signals.

In such an embodiment, a first gate electrode 124h and a second gate electrode 124l are defined by a same protruding portion of the gate line 121 to be connected to each other.

A third gate electrode 124c is defined by a protruding portion from the gate line 121 to be spaced apart from the first and second gate electrodes 124h and 124l.

The first to third gate electrodes 124h, 124l and 124c are connected to the same gate line 121 and are applied with a same gate signal.

The storage electrode line 131 extends substantially in the same direction as the gate line 121, and the storage electrode line 131 is applied with a constant voltage.

The storage electrode line 131 includes a storage electrode 133 and a protruding portion 134 protruding therefrom.

The storage electrode 133 may surround a pixel electrode 191, which will be describe later in greater detail, and the protruding portion 134 protrudes toward the gate line 121.

A gate insulating layer 140 is disposed on the gate line 121, the first to third gate electrodes 124h, 124l and 124c, the storage electrode line 131, the storage electrode 133 and the protruding portion 134. The gate insulating layer 140 may include or be formed of an inorganic insulating material such as a silicon nitride ($SiN_x$), a silicon oxide ($SiO_x$), etc.

In an exemplary embodiment, the gate insulating layer 140 may have a single layer structure or a multi-layer structure.

A first semiconductor layer 154h, a second semiconductor layer 154l and a third semiconductor layer 154c are disposed on the gate insulating layer 140.

The first semiconductor layer 154h may be disposed on the first gate electrode 124h, the second semiconductor layer 154l may be disposed on the second gate electrode 124l, and the third semiconductor layer 154c may be disposed on the third gate electrode 124c.

A data line 171, a first source electrode 173h, a first drain electrode 175h, a second source electrode 173l, a second drain electrode 175l, a third source electrode 173c and a third drain electrode 175c are disposed on the first to third semiconductor layers 154h, 154l and 154c, and the gate insulating layer 140.

The first to third semiconductor layers 154h, 154l and 154c may be disposed not only on the first to third gate electrodes 124h, 124l and 124c, but also under the data line 171.

In an alternative exemplary embodiment, the second and third semiconductor layers 154l and 154c may be integrally formed such that the second and third semiconductor layers 154l and 154c may be connected to each other, but not being limited thereto.

In another alternative exemplary embodiment, and the first to third semiconductor layers 154h, 154l and 154c may be disposed only on the first to third gate electrodes 124h, 124l and 124c, or the second and third semiconductor layers 154l and 154c may be disposed to be spaced apart from each other.

The data line 171 transmits a data voltage, and extends substantially in a vertical direction to cross the gate line 121.

The first source electrode 173h may protrude above the first gate electrode 124h from the data line 171.

The first source electrode 173h may have a "C"-like shape that is bent above the first gate electrode 124h.

The first drain electrode 175h is disposed on the first gate electrode 124h to be spaced apart from the first source electrode 173h.

A channel is formed at an exposed portion of the first semiconductor layer 154h between the first source electrode 173h and the first drain electrode 175h that are spaced apart from each other.

The second source electrode 173l protrudes above the second gate electrode 124l from the data line 171.

The second source electrode 173l may have a "C"-like shape that is bent above the second gate electrode 124l.

The second drain electrode 175*l* is disposed on the second gate electrode 124*l* to be spaced apart from the second source electrode 173*l*.

A channel is formed at an exposed portion of the second semiconductor layer 154*l* between the second source electrode 173*l* and the second drain electrode 175*l* that are spaced apart from each other. The third source electrode 173*c* is disposed on the protruding portion 134 and the third gate electrode 124*c*. One end of the third source electrode 173*c* may have a "C"-like shape that is bent above the third gate electrode 124*c*.

The third drain electrode 175*c* is connected to the second drain electrode 175*l*, and is disposed on third gate electrode 124*c* to be spaced apart from the third source electrode 173*c*.

A channel is formed at an exposed portion of the third semiconductor layer 154*c* between the third source electrode 173*c* and the third drain electrode 175*c* that are spaced apart from each other.

The first gate electrode 124*h*, the first semiconductor layer 154*h*, the first source electrode 173*h*, and the first drain electrode 175*h* that are described above form a first switching element.

In addition, the second gate electrode 124*l*, the second semiconductor layer 154*l*, the second source electrode 173*l*, and the second drain electrode 175*l* form a second switching element. The third gate electrode 124*c*, the third semiconductor layer 154*c*, the third source electrode 173*c*, and the third drain electrode 175*c* form a third switching element.

A passivation layer 180 is disposed on the data line 171, the first to third source electrodes 173*h*, 173*l* and 173*c*, the first to third drain electrodes 175*h*, 175*l* and 175*c*.

The passivation layer 180 may include or be formed of an organic insulating material or inorganic insulating material, and may have a single layer structure or a multi-layer structure.

In an exemplary embodiment, an organic insulating material may be the color filter.

In the passivation layer 180, a first contact hole 185*h* is defined to at least partially expose the first drain electrode 175*h*, a second contact hole 185*l* is defined to at least partially expose the second drain electrode 175*l*, and a third contact hole 185*c* is defined to at least partially expose the protruding portion 134 and the third source electrode 173*c*.

A pixel electrode 191 including a first subpixel electrode 191*h* and a second subpixel electrode 191*l* is disposed on the passivation layer 180.

In an exemplary embodiment, a bridge electrode 195 is further disposed on the passivation layer 180.

The first subpixel electrode 191*h* is connected to first drain electrode 175*h* through the first contact hole 185*h*, and the second subpixel electrode 191*l* is connected to the second drain electrode 175*l* through the second contact hole 185*l*.

The bridge electrode 195 electrically connects the protruding portion 134 with the third source electrode 173*c* through the third contact hole 185*c*.

In such an embodiment, the third source electrode 173*c* is connected to the storage electrode line 131 such that the third source electrode 173*c* is applied with the constant voltage through the storage electrode line 131.

The first and second subpixel electrodes 191*h* and 191*l* are respectively applied with the data voltage from the first and second drain electrodes 175*h* and 175*l*.

In an exemplary embodiment, the data voltage applied to the second drain electrode 175*l* is partially divided by the third source electrode 173*c*. Accordingly, in such an embodiment, the second subpixel voltage applied to the second subpixel electrode 191*l* is less than the first subpixel voltage applied to the first subpixel electrode 191*h* when the data voltage applied to the first and second subpixel electrodes 191*h* and 191*l* has positive polarity (+), and on the contrary, when the data voltage applied to the first and second subpixel electrodes 191*h* and 191*l* has negative polarity (−), the first subpixel voltage applied to the first subpixel electrode 191*h* is less than the second subpixel voltage applied to the second subpixel electrode 191*l*.

The second subpixel voltage applied to the second subpixel electrode 191*l* is preferably less than about 0.9 times the first subpixel voltage applied to the first subpixel electrode 191*h*.

In one exemplary embodiment, for example, the second subpixel voltage may be about 0.75 times to about 0.85 times the first subpixel voltage.

The first and second subpixel electrodes 191*h* and 191*l* applied with the data voltage generate an electric field together with the common electrode 270 of the upper display panel 200, such that the electric filed determines directions of the liquid crystal molecules 310 of the liquid crystal layer 3 between the two electrodes 191 and 270.

In such an embodiment, luminance of the light passing through liquid crystal layer 3 can be varied based on the directions of the liquid crystal molecules 310 determined as such.

The first subpixel electrode 191*h* and the common electrode 270 form the first liquid crystal capacitor Clch (FIG. 3) together with the liquid crystal layer 3 interposed therebetween, and the second subpixel electrode 191*l* and the common electrode 270 form the second liquid crystal capacitor Clcl (FIG. 3) together with the liquid crystal layer 3 interposed therebetween, such that they maintain the applied voltage even after the first and second thin film transistors are turned off.

The first and second subpixel electrodes 191*h* and 191*l* may overlap the storage electrode line 131 as well as the storage electrode 133 to form first and second storage capacitors, and the first and second storage capacitors may respectively enhance voltage holding capabilities of the first and second liquid crystal capacitors Clch and Clcl.

The first subpixel electrode 191*h* has substantially a rhombus shape, and the second subpixel electrode 191*l* surrounds the first subpixel electrode 191*h*.

The pixel electrode 191 may further include a second cutout 91 that is adjacently disposed along at least one of edges of the second subpixel electrode 191*l*, and a third cutout 93 that separates the first subpixel electrode 191*h* from the second subpixel electrode 191*l*.

A first alignment layer 11 is disposed on the pixel electrode 191 and the passivation layer 180.

The first alignment layer 11 may be a vertical alignment layer, or an alignment layer that is photo-aligned by a photopolymerizable material.

Next, the upper display panel 200 will be described.

In an exemplary embodiment, the upper display panel 200 includes a second insulation substrate 210 and a light blocking member 220 disposed on the second insulation substrate 210.

The light blocking member 220 may include or be formed of a black matrix, and effectively prevents light leakage.

The light blocking member 220 may be disposed on an edge of the pixel area and on the first to third thin film transistors.

A plurality of color filters 230 is disposed on the second substrate 210.

The color filters 230 are disposed inside a region surrounded by the light blocking member 220, and may be elongated along a column of the pixel electrodes 191.

An edge of the color filters 230 may partially overlap the light blocking member 220.

Each color filter 230 may display one of three primary colors such as red, green and blue, for example. In such an embodiment, the color filter may also display one of cyan, magenta, yellow, and white-based colors, not being limited to the three primary colors of red, green and blue.

At least one of the light blocking member 220 and the color filter 230 may be disposed on the first substrate 110.

An overcoat 240 may be disposed on the light blocking member 220 and the color filter 230.

The common electrode 270 is disposed on the overcoat 240.

The common electrode 270 includes a cross-shaped first cutout 271.

A second alignment layer 21 is disposed on the common electrode 270.

The second alignment layer 21 may be a vertical alignment layer, or an alignment layer that is photo-aligned by a photopolymerizable material.

Polarizers (not shown) may be provided on outer surfaces of the lower and upper display panels 100 and 200, and polarization axes of the two polarizers are perpendicular to each other and one of the polarization axes may be formed in parallel with the gate line 121.

In an exemplary embodiment, where the liquid crystal display is a reflective type of display device, one of the two polarizers may be omitted.

While the invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A liquid crystal display comprising:
    a first substrate;
    a gate line disposed on the first substrate;
    a divided reference voltage line disposed on the first substrate and electrically separated from the gate line;
    a gate insulating layer disposed on the gate line and the divided reference voltage line;
    a semiconductor layer disposed on the gate insulating layer;
    a data line disposed on the semiconductor layer;
    a passivation layer disposed on the data line;
    a pixel electrode disposed on the passivation layer;
    a second substrate disposed opposite to the first substrate; and
    a common electrode disposed on the second substrate, wherein
    the divided reference voltage line and the data line are elongated to a first side of the first substrate such that the divided reference voltage line and the data line are connected to a divided reference voltage driving line and a data driving line,
    a data driving line extension connected to the data driving line, a divided reference voltage driving line extension connected to the divided reference voltage driving line and a common voltage driving line extension are disposed at the first side of the first substrate,
    a first spacer is disposed on the data driving line extension to contact an upper mother substrate,
    the divided reference voltage driving line extension and the common voltage driving line extension are connected to each other through a first resistor,
    the divided reference voltage driving line extension and the data driving line extension are connected to each other through a second resistor, and
    a first resistance of the first resistor is greater than a second resistance of the second resistor.

2. The liquid crystal display of claim 1, wherein a ratio of the first resistance to the second resistance is in a range of about 1:0.2 to about 1:0.5.

3. The liquid crystal display of claim 2, wherein a common voltage driving line connected to the common voltage driving line extension is disposed in a second side of the first substrate, and
the common voltage driving line is connected to the upper mother substrate via a second spacer disposed therebetween at the second side.

4. The liquid crystal display of claim 2, wherein each of the first and second resistors comprises an indium zinc oxide wire, and
a length of the indium zinc oxide wire of the first resistor is longer than a length of the indium zinc oxide wire of the second resistor.

5. The liquid crystal display of claim 2, wherein each of the first and second resistors comprises an indium zinc oxide wire, and
a width of the indium zinc oxide wire of the first resistor is less than a width of the indium zinc oxide wire of the second resistor.

6. The liquid crystal display of claim 2, wherein each of the first and second resistors comprises a semiconductor material, and
a width of the first resistor is less than a width of the second resistor.

7. The liquid crystal display of claim 6, wherein the semiconductor material is n+ hydrogenated amorphous silicon in which an n-type impurity is highly doped.

8. The liquid crystal display of claim 2, wherein each of the first and second resistors comprises a semiconductor material, and
a length of the first resistor is length than a length of the second resistor.

9. The liquid crystal display of claim 1, wherein the pixel electrode comprises a first subpixel electrode and a second subpixel electrode, and
a pretilt angle of liquid crystals in a first subpixel electrode region corresponding to the first subpixel electrode is different from the pretilt angle of the liquid crystals of a second subpixel electrode region corresponding to the second subpixel electrode.

* * * * *